United States Patent
Giterman et al.

(10) Patent No.: US 10,002,660 B2
(45) Date of Patent: *Jun. 19, 2018

(54) TRANSISTOR GAIN CELL WITH FEEDBACK

(71) Applicant: Bar-Ilan University, Ramat-Gan (IL)

(72) Inventors: Robert Giterman, Beer-Sheva (IL); Adam Teman, Lausanne (CH); Pascal Meinerzhagen, Hillsboro, OR (US); Andreas Burg, Ecublens (CH); Alexander Fish, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/632,555

(22) Filed: Jun. 26, 2017

(65) Prior Publication Data

US 2017/0294221 A1 Oct. 12, 2017

Related U.S. Application Data

(63) Continuation-in-part of application No. 15/306,796, filed as application No. PCT/IL2015/050452 on Apr. 30, 2015, now Pat. No. 9,691,445.

(Continued)

(51) Int. Cl.
*G11C 5/06* (2006.01)
*G11C 11/41* (2006.01)
(Continued)

(52) U.S. Cl.
CPC .............. *G11C 11/41* (2013.01); *G11C 5/025* (2013.01); *G11C 5/063* (2013.01); *G11C 7/10* (2013.01);
(Continued)

(58) Field of Classification Search
CPC .. G11C 7/10; G11C 5/06; G11C 5/025; G11C 11/4097; G11C 11/412; H01L 27/11; H01L 27/1104
See application file for complete search history.

(56) References Cited

U.S. PATENT DOCUMENTS 5,255,220 A * 10/1993 Filliman .................. G11C 8/16
365/189.04
6,246,083 B1 6/2001 Noble
(Continued)

FOREIGN PATENT DOCUMENTS

WO    WO 2005/064615    7/2005
WO    WO 2013/105460    7/2013
WO    WO 2015/166500    11/2015

OTHER PUBLICATIONS

Supplementary European Search Report and the European Search Opinion dated Nov. 8, 2017 From the European Patent Office Re. Application No. 15786178.2. (12 Pages).
(Continued)

*Primary Examiner* — Pho M Luu

(57) ABSTRACT

A gain cell includes a write bit line input, a read bit line output, a write trigger input and a read trigger input. The write element writes a data level from the write bit line input to the gain cell when triggered by the write trigger input. The retention element buffers between an internal buffer node and an internal storage node during data retention. The retention element also connects or disconnects the buffer node to a first constant voltage according to the data level being retained in the gain cell. The read element decouples the storage node from the read bit line output during data read. The read element also connects and disconnects the read bit line output to a second constant voltage according to the data level being read from the gain cell.

17 Claims, 19 Drawing Sheets

Related U.S. Application Data

(60) Provisional application No. 61/986,915, filed on May 1, 2014.

(51) Int. Cl.
| | | |
|---|---|---|
| *G11C 11/403* | (2006.01) | |
| *G11C 11/4097* | (2006.01) | |
| *G11C 5/02* | (2006.01) | |
| *G11C 7/10* | (2006.01) | |
| *H01L 27/11* | (2006.01) | |
| *G11C 8/14* | (2006.01) | |
| *G11C 8/16* | (2006.01) | |
| *G11C 11/405* | (2006.01) | |

(52) U.S. Cl.
CPC ............... *G11C 8/14* (2013.01); *G11C 8/16* (2013.01); *G11C 11/403* (2013.01); *G11C 11/405* (2013.01); *G11C 11/4097* (2013.01); *H01L 27/1104* (2013.01)

(56) References Cited

U.S. PATENT DOCUMENTS

| | | | | |
|---|---|---|---|---|
| 6,333,892 | B2* | 12/2001 | Hamamoto | G11C 7/1072 |
| | | | | 365/230.01 |
| 6,747,890 | B1 | 6/2004 | Kirihata et al. | |
| 6,831,866 | B1 | 12/2004 | Kirihata | |
| 6,845,059 | B1 | 1/2005 | Wordeman et al. | |
| 7,120,072 | B2 | 10/2006 | Ye et al. | |
| 8,908,418 | B2* | 12/2014 | Yabuuchi | G11C 11/419 |
| | | | | 365/154 |
| 9,691,445 | B2* | 6/2017 | Giterman | G11C 11/403 |
| 2011/0103137 | A1 | 5/2011 | Beat | |
| 2015/0003165 | A1 | 1/2015 | Yamauchi | |
| 2017/0062024 | A1 | 3/2017 | Giterman et al. | |

OTHER PUBLICATIONS

International Preliminary Report on Patentability dated Nov. 10, 2016 From the International Bureau of WIPO Re. Application No. PCT/IL2015/050452. (5 Pages).
International Search Report and the Written Opinion dated Aug. 12, 2015 From the International Searching Authority Re. Application No. PCT/IL2015/050452.
Notice of Allowance dated Mar. 2, 2017 From the US Patent and Trademark Office Re. U.S. Appl. No. 15/306,796. (11 pages).
Notice of Allowance dated Jan. 27, 2017 From the US Patent and Trademark Office Re. U.S. Appl. No. 15/306,796. (8 pages).
Calhoun et al. "A 256-Kb 65-Nm Sub-Threshold SRAM Design for Ultra-Low-Voltage Operation", IEEE Journal of Solid-State Circuits, 42(3): 680-688, Mar. 2007.
Chang et al. "A 32 Kb 10T Sub-Threshold SRAM Array With Bit-Interleaving and Differential Read Scheme in 90 Nm CMOS", IEEE Journal of Solid-State Circuits, 44(2): 650-658, Published Online Jan. 27, 2009.
Chun et al. "A Sub-0.9V Logic-Compatible Embedded DRAM with Boosted 3T Gain Cell, Regulated Bit-line Write Scheme and PVT-Tracking Read Reference Bias", Symposium on VLSI Circuits Digest of Technical Papers, pp. 134-135, 2009.
Chun et al. "A 2T1C Embedded DRAM Macro with No Boosted Supplies Featuring a 7T SRAM Based Repair and a Cell Storage Monitor," IEEE Journal of Solid-State Circuits, 47(10): 2517-2526, 2012.
Chun et al. "A 667 MHz Logic-Compatible Embedded DRAM Featuring an Asymmetric 2T Gain Cell for High Speed On-Die Caches," IEEE JSSC, 47(2): 547-559, 2012.
Giterman et al. "4T Gain-Cell with Internal-Feedback for Ultra-Low Retention Power at Scaled CMOS Nodes", IEEE International Symposium on Circuits and Systems (ISCAS): 2177-2180, Jun. 1-5, 2014.
Giterman et al. "Single-Supply 3T Gain-Cell for Low-Voltage Low-Power Applications", IEEE Transactions on Very Large Scale Integration (VLSI) Systems, 24(1): 358-362, Feb. 4, 2015.
Hanson et al. "A Low-Voltage Processor for Sensing Applications With Picowatt Standby Mode", IEEE Journal of Solid-State Circuits, 44(4): 1145-1154, Mar. 25, 2009.
ITRS "International Technology Roadmap for Semiconductors—2012 Update", 76 pages, 2012. Available online at www.itrs.net.
Lee et al. "A 5.4nW/kB Retention Power Logic-Compatible Embedded DRAM with 2T Dual-VT Gain Cell for Low Power Sensing Applications," IEEE Asian Solid-State Circuits Conference, Nov. 8-10, 2010, Beijing, China: 4 pages.
Meinerzhagen et al. "Exploration of Sub-VT and Near-VT 2T Gain-Cell Memories for Ultra-Low Power Applications Under Technology Scaling," Journal of Low Power Electronics and Applications, 3(2): 54-72, 2013.
Somasekhar et al. "2 GHz 2 Mb 2T Gain Cell Memory Macro with 128 GBytes/sec Bandwidth in a 65 nm Logic Process Technology," IEEE JSSC, 44(1): 174-185, 2009.
Teman et al. "A 250 mV 8 Kb 40 Nm Ultra-Low Power 9T Supply Feedback SRAM (SF-SRAM)", IEEE Journal of Solid-State Circuits, 46(11): 2713-2726, Sep. 1, 2011.
Teman et al. "Review and Classification of Gain Cell eDRAM Implementations", IEEE 27th Convention of Electrical and Electronics Engineers in Israel, Nov. 17, 2012.
Zhang et al. "A 3-GHz 70Mb Sram in 65nm Cmos Technology with Integrated Column-Based Dynamic Power Supply," IEEE Journal of Solid-State Circuits, 41(1): 146-151, 2006.

* cited by examiner

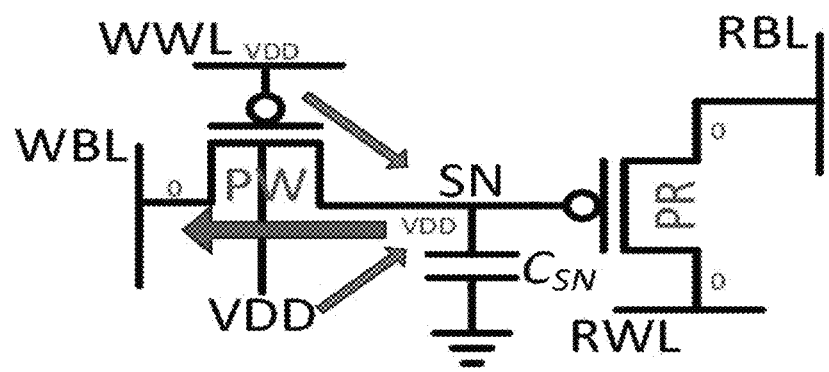
FIGURE 1A – Prior Art
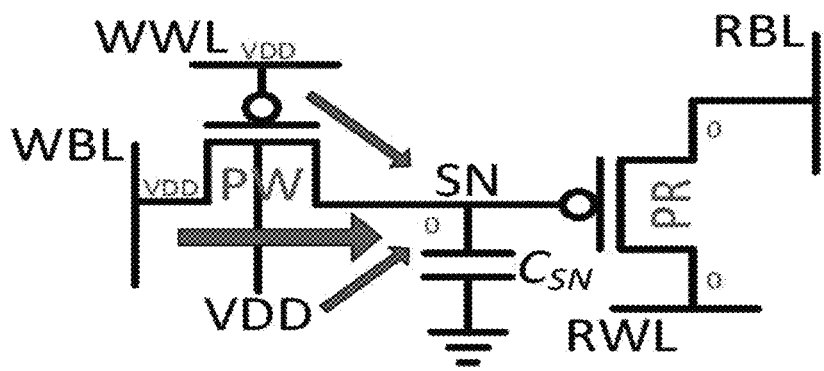
FIGURE 1B – Prior Art

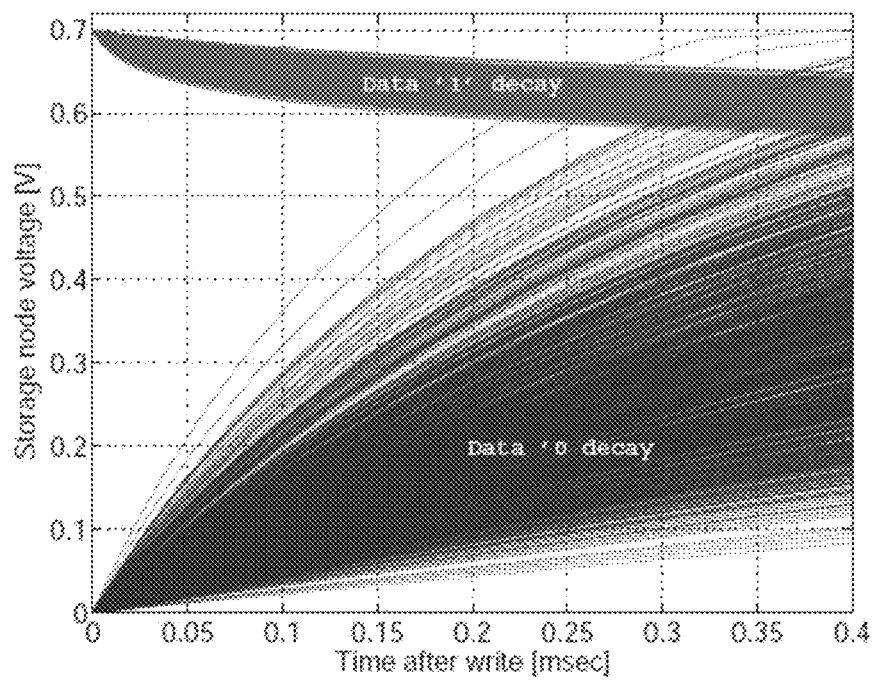
FIGURE 1C
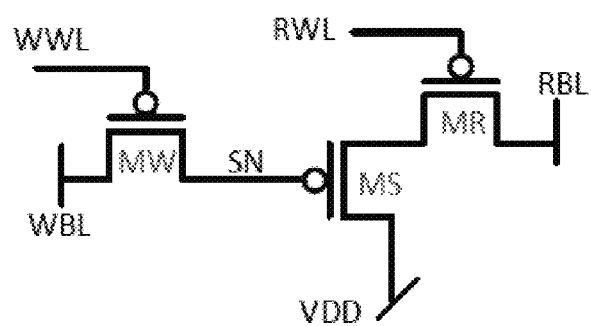
FIGURE 2 – Prior Art

1

TRANSISTOR GAIN CELL WITH FEEDBACK

RELATED APPLICATIONS

This application is a Continuation-in-Part (CIP) of U.S. patent application Ser. No. 15/306,796 filed on Oct. 26, 2016, now U.S. Pat. No. 9,691,445, which is a National Phase of PCT Patent Application No. PCT/IL2015/050452 having International filing date of Apr. 30, 2015, which claims the benefit of priority under 35 USC § 119(e) of U.S. Provisional Patent Application No. 61/986,915 filed on May 1, 2014. The contents of the above applications are all incorporated by reference as if fully set forth herein in their entirety.

FIELD AND BACKGROUND OF THE INVENTION

The present invention, in some embodiments thereof, relates to a gain cell with internal feedback and, more particularly, but not exclusively, to a five-transistor gain cell with internal feedback.

Modern microprocessors and other VLSI systems-on-chip (SoCs) implemented in aggressively scaled CMOS technologies are characterized by high leakage currents, and require an increasing amount of embedded memory [ref. 1]. Such embedded memory, typically implemented as 6-transistor (6T)-bitcell SRAM macrocells, not only consume an ever growing share of the total silicon area but also significantly contributes to the leakage power of the system. (The leakage power is a large share of the total power budget in deeply scaled CMOS nodes.) Unfortunately, besides several advantages like fast access speed and robust, static data retention, the 6T SRAM bitcell is relatively large, exhibits several leakage paths, and has dramatically increased failure rates under voltage scaling.

Additionally, in ultra-low power (ULP) applications the silicon area is often dominated by embedded memories, which are the main consumers of both the static and dynamic power in these applications. Supply voltage scaling down to the sub-threshold region is widely used to significantly reduce both the static and dynamic power dissipation of ULP applications. However, embedded memories, typically implemented with SRAM, have been the limiting factor for aggressive voltage scaling, since the conventional 6T SRAM bitcell becomes unreliable at near-threshold operating voltages.

Gain-cell embedded DRAM (GC-eDRAM) is an alternative to conventional SRAM memories, as it is fully logic-compatible, offers smaller area, and can consume lower standby power than SRAM. GC-eDRAM may be compatible with sub-threshold operation in mature process nodes, such as 180 nm technology. However, GC-eDRAM requires periodic power-hungry refresh cycles to retain its data.

The Data Retention Time (DRT) of GC-eDRAMs is the maximum time interval from writing a data level into the bitcell to still being able to correctly read out the written level. The DRT is primarily limited by the level set by the initial charge stored in the bitcell and the leakage currents that degrade this level. Gain cell implementations in mature technology nodes, such as 180 nm, have been shown to exhibit high DRTs of tens to hundreds of milliseconds [ref. 4,5]. However conventional 2T gain cells in newer technology nodes, such as 65 nm, display much lower DRTs of only tens of microseconds [ref. 6]. The lower DRT is a direct consequence of the substantially higher leakage currents which result in a much faster deterioration of the stored levels [ref. 5]. Depending on the type of write transistor (WT), one of the data levels has a much higher retention time than the other (e.g. data '1' for a PMOS WT and data '0' for a NMOS WT) [ref. 6]. However, when determining the refresh frequency, one must consider the deterioration of the weaker data level under worst-case conditions, i.e. when the write bit line (WBL) is driven to the opposite level of the stored data during retention periods. While mature technology nodes offered sufficient retention times at low operating voltages, process scaling has led to a substantial decrease in retention time, limiting the operating voltage of GC-eDRAM in sub-100 nm technologies to the near-threshold or even above-threshold domain.

SUMMARY OF THE INVENTION

Embodiments herein present gain cells, optionally for use in scaled CMOS nodes characterized by high leakage currents. The gain cell protects the "weak" data level with relatively fast decay by a conditional, cell-internal feedback path. The feedback is disabled for the "strong" data level with relatively slow decay.

The feedback path is optionally implemented by a retention element which includes two switching elements. One switching element is controlled by the write line to provide a buffer effect between the write element and the read element during data retention (standby). The second switching element opens a path to a constant voltage (or ground) when the "weak" data level is retained at the storage node.

Embodiments are presented herein of:

1) Four-transistor (4T) gain cells in which the read element is a single transistor, the retention element includes two transistors and the write element is a single transistor;

2) Five-transistor (5T) gain cells in which the read element includes two transistors, the retention element includes two transistors and the write element is a single transistor;

3) Five-transistor (5T) gain cells in which the read element is a single transistor, the retention element includes two transistors and the write element includes two transistors; and 4) Six-transistor (6T) gain cells in which the read element includes two transistors, the retention element includes two transistors and the write element includes two transistors.

According to an aspect of some embodiments of the present invention there is provided a gain cell which includes:

A) a write bit line input;
B) a read bit line output;
C) a write trigger input;
D) a read trigger input;
E) a write element, which includes a write bit line connection connected to the write bit line input, a write trigger connection connected to the write trigger line input and a buffer node connection connected to an internal buffer node;
F) a retention element; and
G) a read element.

The write element writes a data level from the write bit line input to the gain cell when triggered by the write trigger input. The retention element buffers between the buffer node and an internal storage node during data retention, connects the buffer node to a first constant voltage during retention of a first data level at the storage node and disconnects the buffer node from the first constant voltage during retention of a second data level at the storage node. The read element decouples the storage node from the read bit line output during data read. The read element connects the read bit line output to a second constant voltage when a data level associated with the second constant voltage is read from the gain cell and disconnects the read bit line output from the second constant voltage when the opposite data level is read from the gain cell.

According to some embodiments of the invention, the read element includes:

a first read switch comprising a first read data input, a first read control input and a first read data output; and a second read switch comprising a second read data input, a second read control input and a second read data output. The first read data input is connected to the second constant voltage level, the first read control input is connected to the storage node, the first read data output is connected to the second read data input, the second read control input is connected to the read trigger input, and the second read data output is connected to the read bit line output.

According to some embodiments of the invention, the write element and the retention element are formed of n-type transistors, the read element is formed of p-type transistors and the first voltage level equals the second voltage level.

According to some embodiments of the invention, the write element and the retention element are formed of p-type transistors, the read element is formed of n-type transistors and the first voltage level equals the second voltage level.

According to some embodiments of the invention, the write element, the retention element and the read element are formed of the same type of transistor, and the first voltage level differs from the second voltage level.

According to some embodiments of the invention, the write element includes:

a first write switch comprising a first write data input, a first write switch input and a first write data output; and a second write switch comprising a second write data input, a second write control input and a second write data output, The first write switch and the second write switch are of complementary types. The first write data input and the second write data input are connected to the write bit line input, the first write control input and the second write control input are respectively connected to the write trigger input and to a complementary write trigger line, and the first write data output and the second write data output are connected to the buffer node. According to further embodiments of the invention, the first write switch is a p-type transistor and the second write switch is an n-type transistor.

According to some embodiments of the invention, the retention element connects the buffer node to the storage node during a write bit operation and disconnects the buffer node from the storage node during data retention.

According to some embodiments of the invention, the retention element includes:

a buffer switch, having a buffer input, a buffer output and a buffer control input; and a feedback switch associated with the buffer switch, having a feedback input, a feedback output and a feedback control input, wherein the feedback input is connected to the first constant voltage;

The buffer switch input is connected to the buffer node and to the feedback switch output, and the buffer switch output is connected to the storage node and to the feedback control input and the buffer control input is connected to the write trigger input. The buffer switch connects the buffer input to the buffer output when the write trigger is on and disconnects the buffer input from the buffer output when the write trigger is off. The feedback switch connects the feedback input to the feedback output when the feedback control input is at the first data level and disconnects the feedback input from the feedback output when the feedback control input is at the second data level.

According to some embodiments of the invention, the gain cell includes multiple transistors, and at least two of the transistors operate at different threshold voltages.

According to an aspect of some embodiments of the present invention there is provided a memory array which includes multiple gain cells as embodied herein. Respective write bit line inputs of the gain cells are connected to form a common write bit line, and respective read bit line outputs of the gain cells are connected to form a common read bit line output. At least some of the gain cells contain a respective: write bit line input, read bit line output, write trigger input, read trigger input, write element, retention element and read element. The gain cell's respective write element includes a write bit line connection connected to the write bit line input, a write trigger connection connected to the write trigger line input and a buffer node connection connected to an internal buffer node. The respective write element writes a data level from the write bit line input to the gain cell when triggered by the write trigger input. The respective retention element buffers between the buffer node and an internal storage node during data retention, connects the buffer node to a first constant voltage during retention of a first data level at the storage node disconnects the buffer node from the first constant voltage during retention of a second data level at the storage node. The respective read element decouples the storage node from the read bit line output during data read. The read element connects the read bit line output to a second constant voltage when a data level associated with the second constant voltage is read from the gain cell and disconnects the read bit line output from the second constant voltage when the opposite data level is read from the gain cell.

According to an aspect of some embodiments of the present invention there is provided a gain cell which includes:

A) a write bit line input;
B) a read bit line output;
C) a write trigger input;
D) a read trigger input;
E) a write element, which includes a first write switch with a first write data input, a first write control input and a first write data output and a second write switch with a second write data input, a second write control input and a second write data output. The first write switch and the second write switch are of complementary types. The first write data input and the second write data input are connected to the write bit line input; the first write control input and the second write control input are respectively connected to the write trigger input and a complementary write trigger line; and the first write data output and the second write data output are connected to an internal buffer node;
F) a retention element; and
G) a read element which includes a read bit line connection connected to the read bit line output, a read trigger connection connected to the read trigger input and a storage node connection connected to the storage node.

The retention element buffers between the buffer node and an internal storage node during data retention, connects the buffer node to a first constant voltage during retention of a first data level at the storage node and disconnects the buffer node from the first constant voltage during retention of a second data level at the storage node. The read element retains the read bit line output at its present voltage level when a first data level is read from the gain cell and drives the read bit line output to a different voltage level when the opposite data level is read from the gain cell.

According to some embodiments of the invention, the read element decouples the storage node from the read bit line output during data read, connects the read bit line output to a second constant voltage when a data level associated with the second constant voltage is read from the gain cell and disconnects the read bit line output from the second constant voltage when the opposite data level is read from the gain cell.

According to some embodiments of the invention, the read element includes:

a first read switch comprising a first read data input, a first read control input and a first read data output; and a second read switch comprising a second read data input, a second read control input and a second read data output. The first read data input is connected to a second constant voltage level, the first read control input is connected to the storage node, the first read data output is connected to the second read data input, the second read control input is connected to the read trigger input and the second read data output is connected to the read bit line output.

According to some embodiments of the invention, the read element the retention element includes:

a buffer switch, having a buffer input, a buffer output and a buffer control input; and a feedback switch having a feedback input, a feedback output and a feedback control input. The feedback input is connected to the first constant voltage.

The buffer switch input is connected to the buffer node and to the feedback switch output, and the buffer switch output is connected to the storage node and to the feedback control input and the buffer control input is connected to the write line input. The buffer switch connects the buffer input to the buffer output when the write trigger is on and disconnects the buffer input from the buffer output when the write trigger is off. The feedback switch connects the feedback input to the feedback output when the feedback control input is at the first data level and disconnects the feedback input from the feedback output when the feedback control input is at the opposite data level.

According to some embodiments of the invention, the gain cell includes multiple transistors, and at least two of the transistors operate at different threshold voltages.

According to an aspect of some embodiments of the present invention there is provided a memory array which includes multiple gain cells as embodied herein. Respective write bit line inputs of the gain cells are connected to form a common write bit line, and respective read bit line outputs of the gain cells are connected to form a common read bit line output. At least some of the gain cells contain a respective: write bit line input, read bit line output, write trigger input, read trigger input, write element, retention element and read element. The gain cell's respective write element includes a first write switch with a first write data input, a first write control input and a first write data output and a second write switch with a second write data input, a second write control input and a second write data output. The first write switch and the second write switch are of complementary types. The first write data input and the second write data input are connected to the write bit line input; the first write control input and the second write control input are respectively connected to the write trigger input and a complementary write trigger line; and the first write data output and the second write data output are connected to an internal buffer node. The read element has a read bit line connection connected to the read bit line output, a read trigger connection connected to the read trigger input and a storage node connection connected to the storage node. The retention element buffers between the buffer node and an internal storage node during data retention, connects the buffer node to a first constant voltage during retention of a first data level at the storage node and disconnects the buffer node from the first constant voltage during retention of a second data level at the storage node. The read element retains the read bit line output at its present voltage level when a first data level is read from the gain cell and drives the read bit line output to a different voltage level when the opposite data level is read from the gain cell.

According to an aspect of some embodiments of the present invention there is provided a gain cell which includes:

A) a write bit line input;

B) a read bit line output;

C) a write trigger input;

D) a read trigger input;

E) a write transistor, which includes a first diffusion connection, a gate connection, and a second diffusion connection. The first diffusion connection is connected to the write bit line input and the gate connection is connected to the write trigger input;

F) a read transistor, which includes a first diffusion connection, a gate connection and a second diffusion connection. The first diffusion connection is connected to the read bit line output and the second diffusion connection is connected to the read trigger input; and G) a retention element associated with the write transistor and the read transistor.

The retention element buffers between the second diffusion connection of the write transistor and the gate connection of the read transistor during data retention, connects the second diffusion connection of the write transistor to a constant voltage during retention of a first data level at the gate connection of the read transistor, and disconnects the second diffusion connection of the write transistor from the constant voltage during retention of a second data level at the gate connection of the read transistor.

According to some embodiments of the invention, the retention element connects the second diffusion connection of the write transistor to the gate connection of the read transistor during a write bit operation, and disconnects the second diffusion connection of the write transistor from the gate connection of the read transistor during data retention.

According to some embodiments of the invention, the retention element includes:

A) a buffer switch, having a buffer input, a buffer output and a buffer control input; and B) a feedback switch associated with the buffer switch, having a feedback input, a feedback output and a feedback control input, wherein the feedback input is connected to a constant voltage.

The buffer input is connected to the second diffusion connection of the write transistor and to the feedback switch output. The buffer switch output is connected to the gate connection of the read transistor and to the feedback control input, and the write control input is connected to the write trigger input. The buffer switch connects the buffer input to the buffer output when the write trigger is on and disconnects the buffer input from the buffer output when the write trigger is off. The feedback switch connects the feedback input to the feedback output when the feedback control input is at the first data level and disconnects the feedback input from the feedback output when the feedback control input is at the second data level.

According to some embodiments of the invention, the retention element includes:

A) a buffer transistor, having a first diffusion connection, a gate connection connected to the write trigger input, and a second diffusion connection; and B) a feedback transistor, having a first diffusion connection, a gate connection, and a second diffusion connection, wherein the first diffusion connection is connected to a constant voltage.

The first diffusion connection of the buffer transistor is connected to the second diffusion connection of the write transistor and to the second diffusion connection of the feedback transistor. The second diffusion connection of the buffer transistor is connected to the gate connection of the read transistor and to the gate connection of the feedback transistor.

According to some embodiments of the invention, the feedback transistor is a p-type transistor and the constant voltage is a low data voltage level.

According to some embodiments of the invention, the feedback transistor is an n-type transistor and the constant voltage is a high data voltage level.

According to some embodiments of the invention, the gain cell further includes a capacitor between the gate connection of the read transistor and ground.

According to an aspect of some embodiments of the present invention there is provided a memory array which includes a plurality of gain cells as embodied herein. Respective write bit lines inputs of the gain cells are connected to form a common write bit line, and respective read bit line outputs of the gain cells are connected to form a common read bit line output.

According to an aspect of some embodiments of the present invention there is provided a gain cell which includes:

A) a write bit line input;
B) a read bit line output;
C) a write trigger input;
D) a read trigger input;
E) a write transistor, comprising a first diffusion connection, a gate connection, and a second diffusion connection. The first diffusion connection is connected to the write bit line input and the gate connection is connected to the write trigger input;
F) a read transistor, comprising a first diffusion connection, a gate connection and a second diffusion connection, the first diffusion connection is connected to the read bit line output and the second diffusion connection is connected to the read trigger input;
G) a buffer transistor, having a first diffusion connection, a gate connection connected to the write trigger input, and a second diffusion connection; and
H) a feedback transistor, having a first diffusion connection, a gate connection, and a second diffusion connection, wherein the first diffusion connection is connected to a constant voltage.

The first diffusion connection of the buffer transistor is connected to the second diffusion connection of the write transistor and to the second diffusion connection of the feedback transistor. The second diffusion connection of the buffer transistor is connected to the gate connection of the read transistor and to the gate connection of the feedback transistor.

According to some embodiments of the invention, the write transistor, the buffer transistor the feedback transistor and the read transistor are p-type transistors.

According to some embodiments of the invention, the write transistor, the buffer transistor, the feedback transistor and the read transistor are n-type transistors.

According to some embodiments of the invention, the write transistor, the buffer transistor and the feedback transistor are p-type transistors and the read transistor is an n-type transistor.

According to some embodiments of the invention, the write transistor, the buffer transistor and the feedback transistor are n-type transistors and the read transistor is a p-type transistor.

According to an aspect of some embodiments of the present invention there is provided a memory array which includes a plurality of gain cells as embodied herein. Respective write bit line inputs of the gain cells are connected to form a common write bit line input, and respective read bit line outputs of the gain cells are connected to form a common read bit line output.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A and 1B illustrate a prior art 2T PMOS gain cell during retention of a high data level and a low data level respectively;

FIG. 1C shows storage node degradation of a prior art 2T PMOS gain cell following a write operation under the two worst-case biasing situations;

FIG. 2 illustrates a prior art 3T gain cell;

DESCRIPTION OF SPECIFIC EMBODIMENTS OF THE INVENTION

Figure 3A:
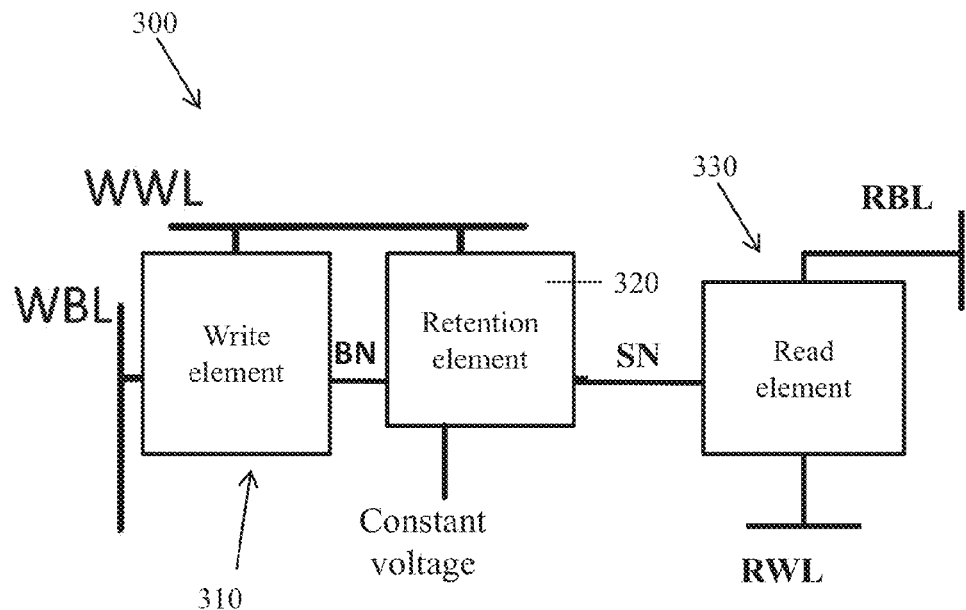
FIG. 3A is a simplified block diagram of a gain cell, according to embodiments of the invention.

The present invention, in some embodiments thereof, relates to a gain cell with internal feedback and, more particularly, but not exclusively, to a five-transistor gain cell with internal feedback.

Embodiments herein present a gain cell that selectively protects a weaker data level by means of a feedback loop. The feedback loop decreases the required refresh frequency and reduces refresh power consumption.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIGS. 1A and 1B illustrate a prior art 2T all-PMOS gain cell during retention of a high data level and a low data level respectively. The PMOS 2T gain cell [ref. 2] is composed of a write transistor (PW), a read transistor (PR), and a storage node (SN). This circuit displays asymmetric retention characteristics with highly advantageous retention of data '1' over data '0'. The worst-case biasing during retention of a '1' occurs when write bitline (WBL) is grounded and subthreshold (sub-$V_T$) leakage discharges SN, as illustrated in FIG. 1A. However, as the stored level decays to $V_{DD}$–Δ, the overdrive of PW ($V_{SG}$–|$V_{Tp}$|) becomes increasingly negative and simultaneously the device becomes reverse body biased. Therefore, the sub-$V_T$ leakage is strongly suppressed and the stored level decays very slowly. On the other hand, when a '0' is stored in the cell and WBL is driven to $V_{DD}$, as illustrated in FIG. 1B, this self-limitation does not occur and the leakage currents gradually charge SN until the data level is lost.

Reference is now made to FIG. 2, which presents simulation results of storage node degradation for a PMOS 2T gain cell following a write operation under the two worst-case biasing situations. The data shown in FIG. 2 was obtained from 1024 Monte Carlo simulations. FIG. 2 shows the superiority of the data '1' level in the PMOS 2T gain cell relative to the data '0' level. FIG. 2 also demonstrates the degraded retention times at scaled technologies, with an estimated DRT of only approximately 200 μs, measured at the earliest intersection between the '0' and '1' samples. Note that FIG. 2 presents a representative estimation of DRT for the purpose of illustrating the principle of data level decay. For full DRT measurement, the array architecture and the read scheme should be taken into account [ref. 6].

Reference is now made to FIG. 2, which is a schematic representation of a prior-art 3T Gain-Cell. The 3T gain-cell decouples the SN from the RBL using a third transistor. For read, the RWL, connected to the gate of MR, is discharged to '0', creating a current path from VDD to the RBL when the cell holds '0' thus enabling a full VDD swing on the RBL during read.

The most significant drawback of both the 2T and 3T cells is their short DRT in sub-100 nm technologies, which is caused by the ever-growing leakage currents at deeply scaled nodes, dominated by sub-threshold leakage from the SN to WBL. This results in decreased memory availability and significantly higher refresh power consumption, making it unsuitable for ULP applications.

Reference is now made to FIG. 3A, which is a simplified block diagram of a gain cell, according to embodiments of the invention. Gain cell 300 includes write element 310, retention element 320 and read element 330.

Optionally, the read element is a two-switch (2-SW) read element, embodiments of which are presented below (e.g. FIGS. 4A-4B). Alternately or additionally, the write element is a two-switch (2-SW) write element, embodiments of which are presented below (e.g. FIGS. 4C-4D).

As used herein the term "2-SW read element" means a read element which is implemented by two switches (as described in more detail below). Exemplary embodiments of gain cells in which the 2-SW read element switches are transistors (denoted herein a 2T read element) are also described below (see FIGS. 9A-9D and 9G).

As used herein the term "2-SW write element" means a write element which is implemented by two switches (as described in more detail below). Exemplary embodiments of gain cells in which the 2-SW write element switches are transistors (denoted herein a 2T write element) are also described below (see FIGS. 9E-9G).

As shown in FIG. 3A, one input of write element 310 is connected to the write bit line (WBL) and a second input is connected to write word line (WWL). WWL serves as a write trigger similarly its function in the 2T gain cell. Read element 330 connects to the read bit line output (RBL) and to the read trigger line (also denoted herein RWL and read word line).

Retention element 320 is connected between write element 310 and read element 330. Retention element 320 forms a buffer node (BN) within the gain cell, and provides a feedback effect which maintains the voltage level at BN when the "weak" data level is being retained at SN. The buffer node (BN) is formed between retention element 320 and the output of write element 310. Retention element 320 also connects to a constant voltage, which may be a low data level (or ground) or a high data level depending on the specific implementation as illustrated by the embodiments presented below.

Retention element 320 serves a dual purpose:

A) Retention element 320 connects and disconnects the buffer node (BN) and the storage node (SN), based on the state of WWL. During write operations, retention element 310 connects BN and SN so that the voltage levels at both nodes are equal. During voltage retention (e.g. standby), retention element 310 disconnects BN from SN.

B) Retention element 320 also provides a feedback mechanism which is controlled by the voltage level at SN during voltage retention. During one logic state (the "weak" state) the output of write element 310 is connected to the constant voltage, which slows the decay of the voltage level at BN. During the opposite logic state (the "strong" state) the output of write element 310 is disconnected from the constant voltage, and the voltage at BN decays relatively slowly due to self-limiting effects (similarly to the 2T gain cell).

Optionally, gain cell 300 further includes a capacitor between SN and ground.

2-SW Retention Element

Figure 3B:
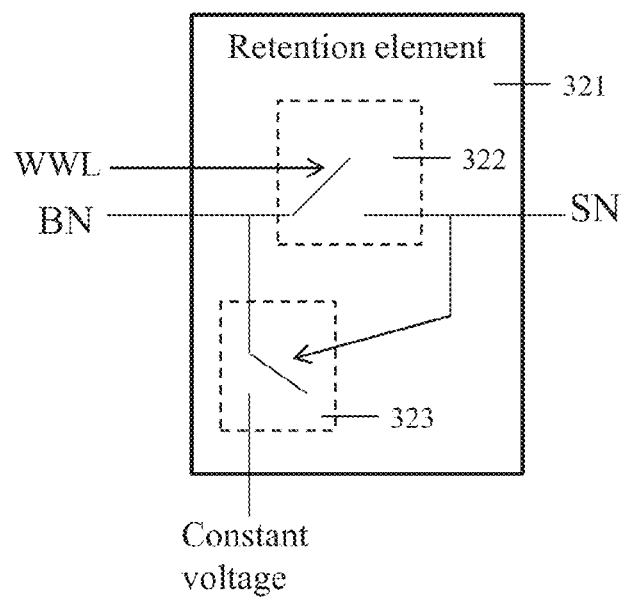
FIG. 3B is a simplified block diagram of a retention element, according to embodiments of the invention.

Reference is now made to FIG. 3B, which is a simplified block diagram of a retention element, according to embodiments of the invention. Retention element 321 includes two switching elements, 322 and 323. Switch 322 connects and disconnects BN and SN according to the WWL level. Switch 323 and disconnects BN from the constant voltage according to the voltage level at SN. Optionally, switches 322 and 323 operate in a complementary manner, meaning that when one of the switches is "on" the other switch is "off" and vice versa.

Optionally, one or both of switching elements 410 and 420 are transistors, with the control signal input (e.g. WWL and/or SN level) being input to the respective transistor gate.

Read Element

Optionally, gain cell 300 includes a read element that decouples the storage node from the read bit line output during data read. The read element also connects the read bit line output to a constant voltage when one data level is read from the gain cell and disconnects the read bit line output from the constant voltage when the opposite data level is read from the gain cell. Thus, for the data level at which the read element connects RBL to the constant voltage, the voltage read at RLB is transferred from a constant voltage source rather than by a connection to SN. Otherwise, RLB is unconnected and remains pre-charged or pre-discharged according to the specific gain cell layout.

Figure 9A:
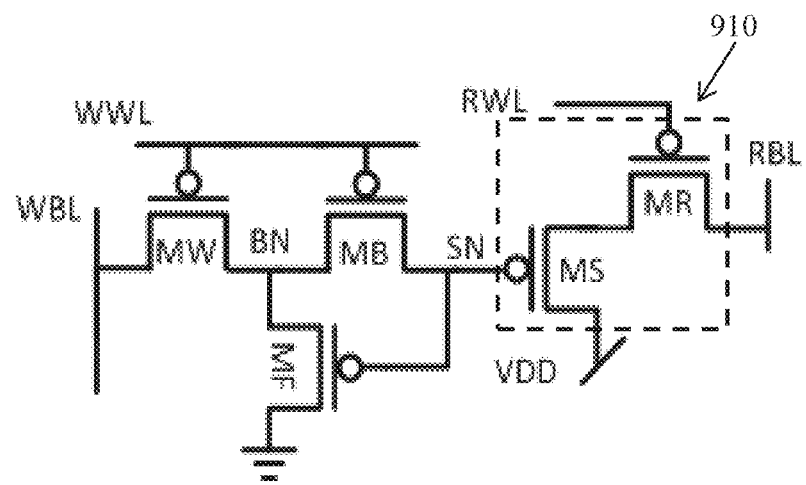
FIGS. 9A-9F are simplified circuit diagrams of a 5T gain cell, according to respective embodiments of the invention.
Figure 9B:
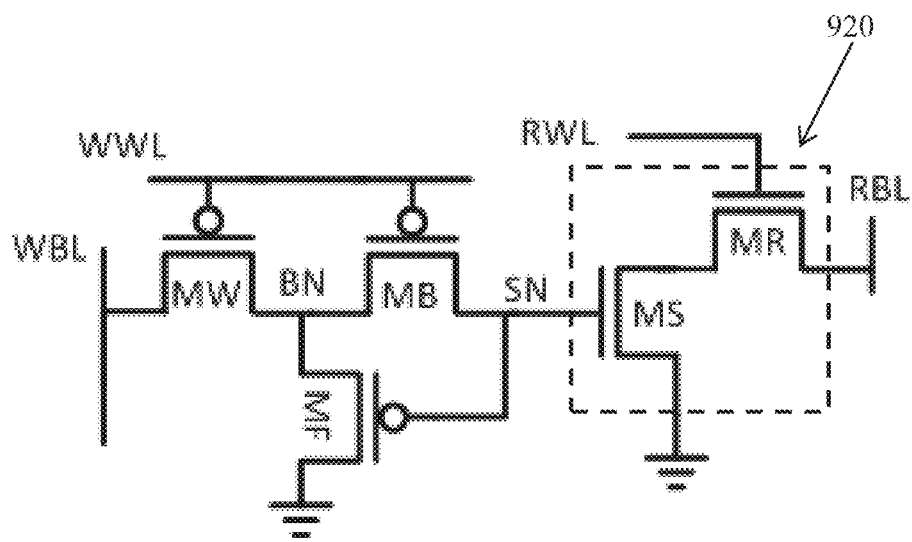
Figure 9C:
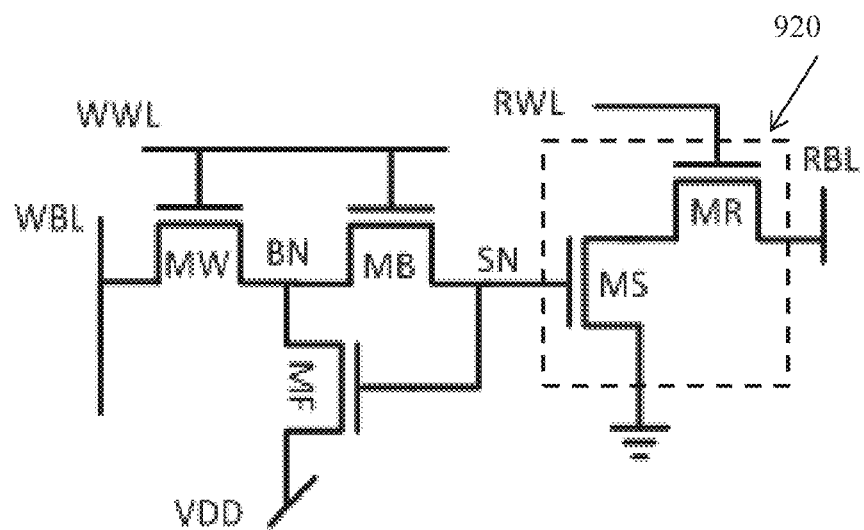

For example, for the read element of FIG. 9C which is composed of n-type transistors, RBL is connected to ground when the cell holds a '1' and is unconnected (i.e. stays precharged to VDD) when the cell holds a '0'. For the read element of FIG. 9A which is composed of p-type transistors, RBL is connected to VDD when the cell holds a '1' and is unconnected (i.e. stays pre-discharged to ground) when the cell holds a '0'.

Since, for the appropriate data level, RBL is decoupled from SN (e.g. by switch 413 in FIG. 4B), leakage currents to other unselected gain cells do not affect the voltage level at RBL. This effect allows RBL to have the full swing from ground to VDD.

Figure 4A:
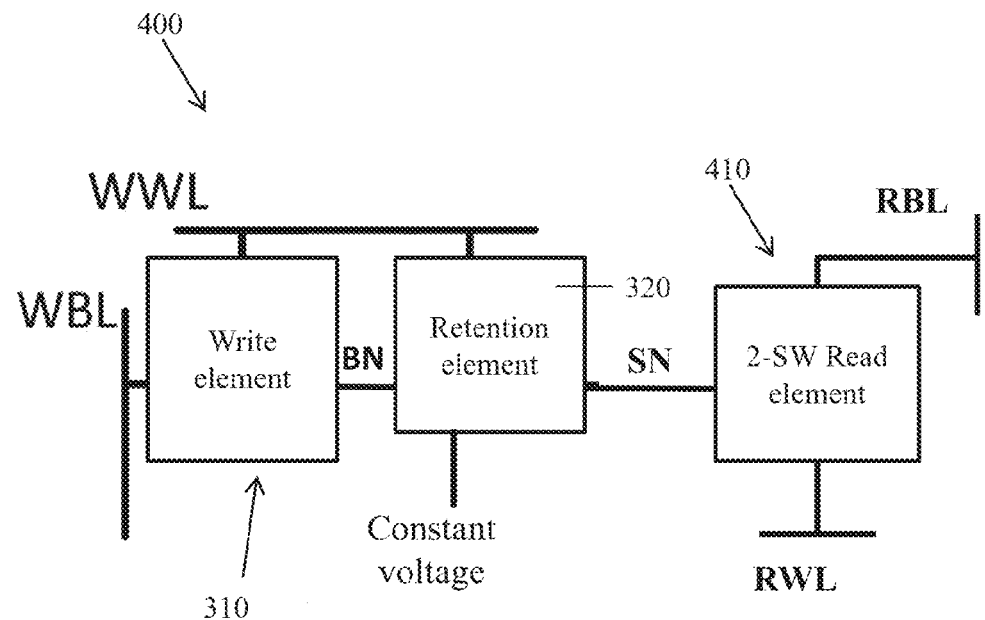
FIG. 4A is a simplified block diagram of a gain cell with a 2-SW read element, according to embodiments of the invention.

Reference is now made to FIG. 4A, which is a simplified block diagram of a gain cell with 2-SW read element, according to exemplary embodiments of the invention. Gain cell 301 includes write element 305, retention element 320 and 2-SW read element 331.

Retention element 320 is connected between the write element output and a control input of 2-SW read element 331. A buffer node (BN) is formed between retention element 320 and the output of write element 305. Retention element 320 also connects to a constant voltage, which may be a low data level (or ground) or a high data level depending on the specific implementation as described below. SN and RWL are control inputs to the switches forming the 2-SW read element 331.

Figure 4B:
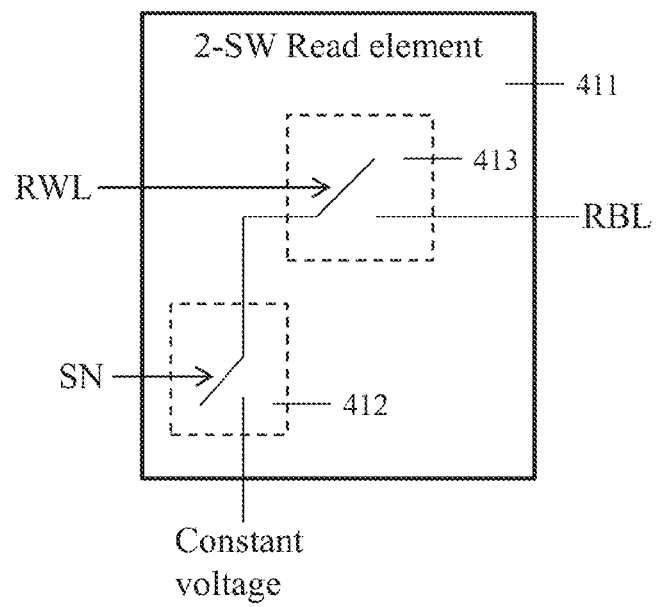
FIG. 4B is a simplified block diagram of a 2-SW read element, according to embodiments of the invention.

Reference is now made to FIG. 4B, which is a simplified block diagram of a 2-SW read element, according to embodiments of the invention. Read element 430 includes two switching elements, 440 and 450. SN and RWL are control inputs to the switches forming the 2-SW read element 331. Switch 410 connects and disconnects a constant voltage from the input to switch 450 according to the SN level. Switch 450 connects and disconnects RBL from the output of switch 440 according to the RWL level.

In order to avoid a limited swing on the RBL, read element 430 uses switch 433 to decouple SN from the RBL. For read, the RWL opens switch 433, enabling a current path from the constant voltage input into switch 432 to the RBL when the cell stores a first data level which closes switch 432 (e.g. '1'). This enables a full swing to the constant voltage on the RBL during read. When the cell stores the opposite data level (e.g. '0'), switch 432 is open and there is no current path to the constant voltage. RBL remains at its precharged (or pre-discharged) level. This reduces power consumption, as well as reducing the possibility of a read failure, especially when operated under a sub-VT supply voltage due to a very small RBL voltage swing.

Optionally, one or both of switching elements 440 and 450 are transistors (denoted herein a 2T read element). Exemplary embodiments of a gain cell with a 2T read element are described below (see FIGS. 9A-9D).

2-SW Write Element

Optionally, the write element is a two-switch element, formed of two complementary switches connected in parallel, and triggered by complementary write line signals (WWL and WWLcomp). The full-swing passing capability of the write element enables the propagation of strong levels to the SN without the need for a boosted word line. Read is performed by precharging the read bit line (RBL) and subsequently driving the read word line (RWL) to GND, thereby conditionally discharging the RBL capacitance if the SN is high (data '1') or blocking the discharge path if the SN is low (data '0').

Figure 4C:
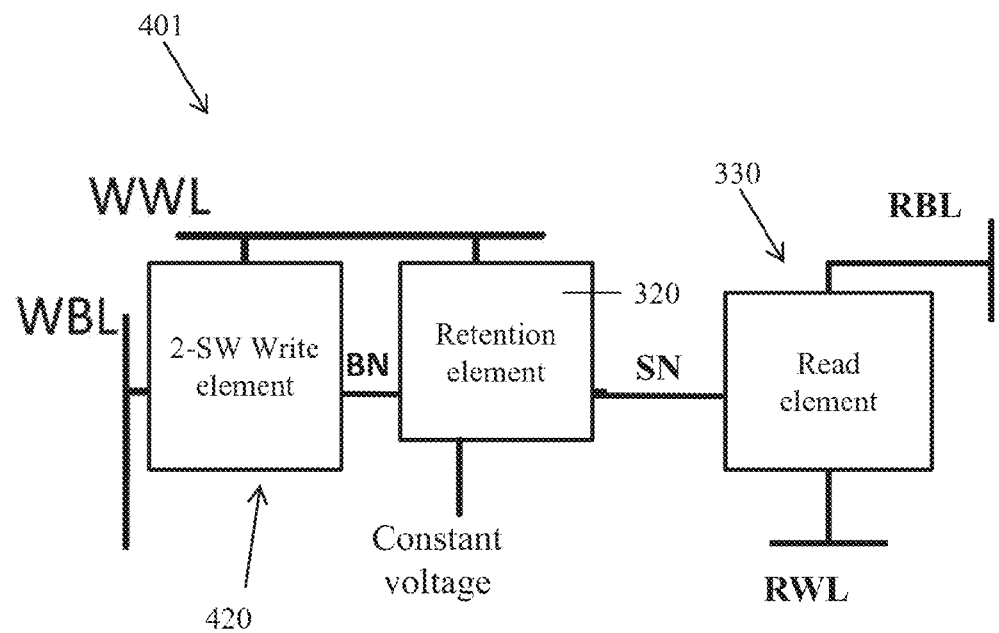
FIG. 4C is a simplified block diagram of a gain cell with a 2-SW write element, according to embodiments of the invention.

Reference is now made to FIG. 4C, which is a simplified block diagram of a gain cell with 2-SW write element, according to embodiments of the invention. Retention element 320 is connected between 2-SW write element 420 and read element 330. Buffer node BN is formed between retention element 320 and 2-SW write element 420. Storage node SN is formed between retention element 320 and read element 330. Retention element 320 also connects to a constant voltage, which may be a low data level (or ground) or a high data level depending on the specific implementation as described below.

Figure 4D:
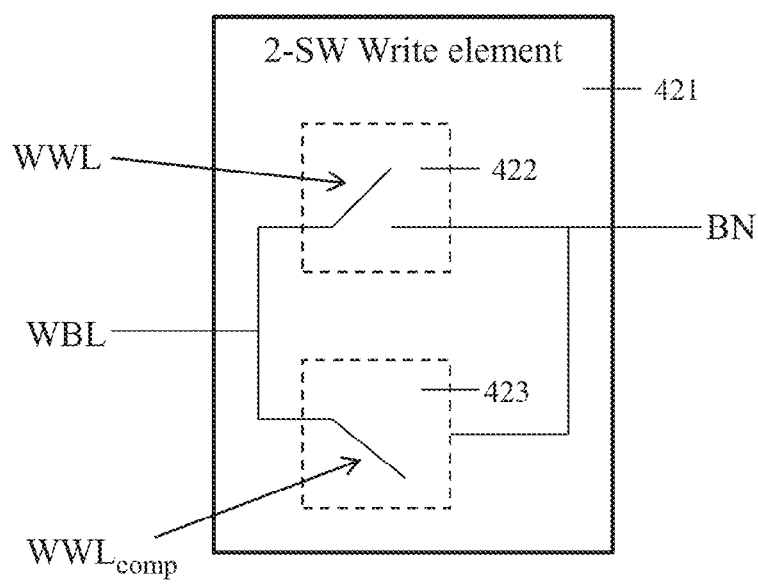
FIG. 4D is a simplified block diagram of a 2-SW write element, according to embodiments of the invention.

FIG. 4D is a simplified block diagram of a 2-SW write element, according to embodiments of the invention. 2-SW write element 421 includes two complementary switching elements, 422 and 423. WWL and WWLcomp respectively close switching elements 422 and 423 during the write operation, strongly coupling WBL to BN (and consequently to SN).

Figure 4E:
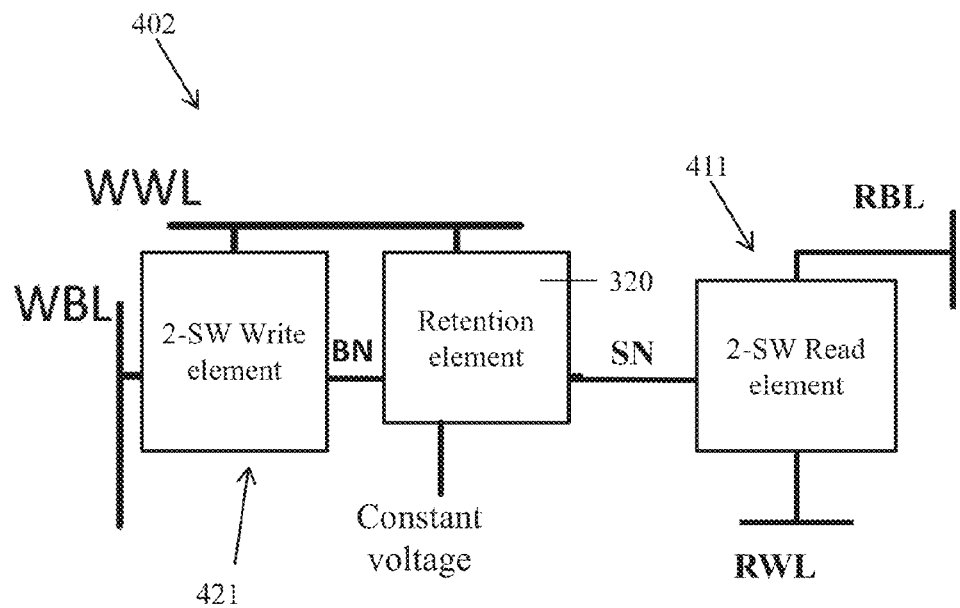
FIG. 4E is a simplified block diagram of a gain cell with a 2-SW read element and 2-SW write element, according to embodiments of the invention.

Reference is now made to FIG. 4E, which is a simplified block diagram of a gain cell, according to embodiments of the invention. In gain cell 402 both the write element and read element are 2-SW elements. The structure and function of retention element 320, 2-SW write element 421 and 2-SW read element 411 may be in accordance with any of the embodiments described herein.

Figure 4F:
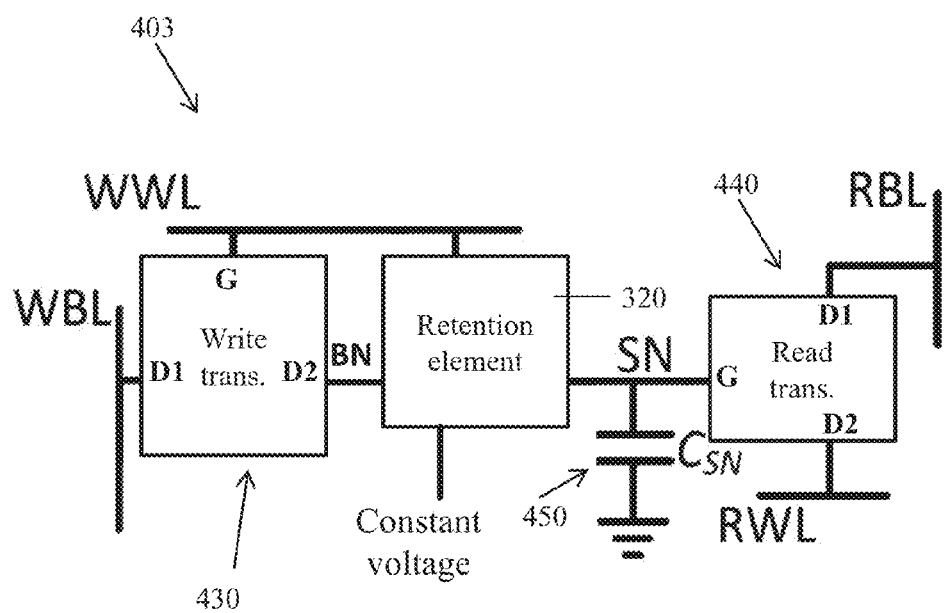
FIG. 4F is a simplified block diagram of a gain cell with a read transistor and a write transistor, according to embodiments of the invention.

Reference is now made to FIG. 4F, which is a simplified block diagram of a gain cell, according to embodiments of the invention. Gain cell 300 includes write transistor 310, retention element 320 and read transistor 330. In FIG. 4F, the D1 diffusion input of write transistor 310 is connected to the write bit line (WBL) and the gate G is connected to write word line (WWL). WWL serves as a write trigger similarly its function in the 2T gain cell. Diffusion connection D1 of read transistor 330 connects to the read bit line output (RBL) and diffusion connection D2 of read transistor 330 connects to the read trigger line (also denoted herein RWL and read word line).

Retention element 320 is connected between the write transistor D2 diffusion connection and the gate of read transistor 330. A buffer node (BN) is formed between retention element 320 and the write transistor D2 diffusion connection. Retention element 320 also connects to a constant voltage, which may be a low data level (or ground) or a high data level depending on the transistor type as described below.

Gain cell 301 further includes capacitor $C_{SN}$ 340, between SN and ground.

Embodiments of gain cells formed of four transistors (4T), five transistors (5T) and six transistors (6T) are presented below.

Optionally, all of the transistors in the gain cell are of the same type. In other embodiments, not all of the transistors in gain cell are of the same type, but rather each transistor is implemented in a respective type which may vary.

A non-limiting list of transistor types which may be included in a gain cell includes:
A) High-VT;
B) Low-VT;
C) Standard-VT; and
D) "IO" transistors.

Optionally, the gain cell includes different threshold transistors (for example a combination of low-VT transistors and regular-VT transistors).

Four-Transistor (4T) Gain Cell

Optionally, the read element, the write element and both switching elements forming the retention element (i.e. 322 and 323 of FIG. 3B) are transistors. This yields a four transistor gain cell (denoted a 4T gain cell), exemplary embodiments of which are described for FIGS. 5 to 8.

Embodiments herein present a four-transistor gain cell that utilizes an internal feedback mechanism to significantly increase the data retention time in scaled CMOS technologies. The resulting gain cell displays a large reduction in retention power, with a reduction in bitcell area (as compared to a standard 6T SRAM).

Figure 5:
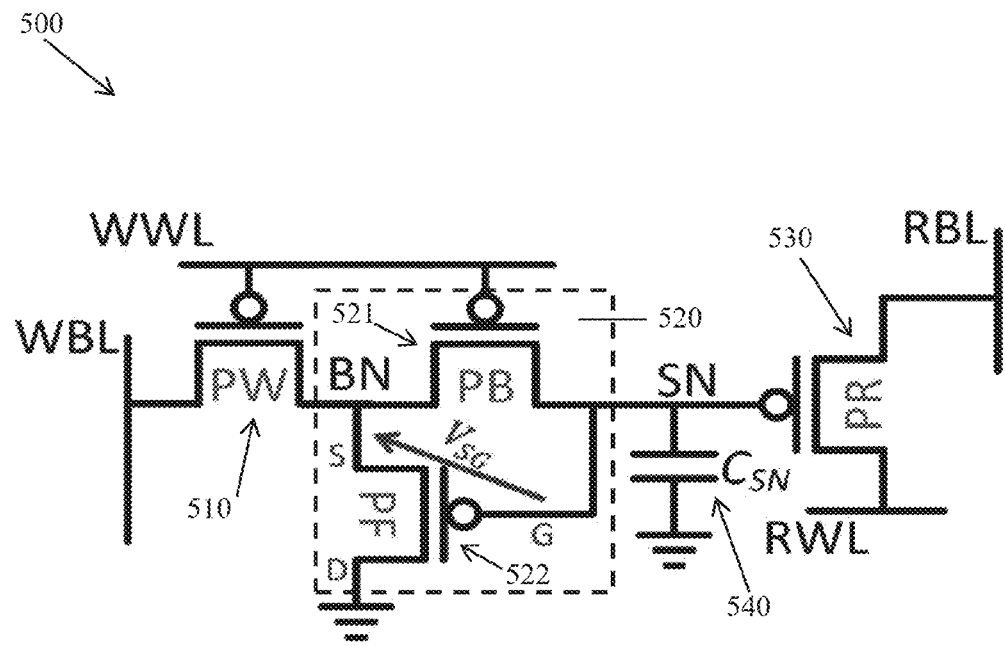
FIG. 5 is a simplified diagram of a gain cell which includes four p-type transistors, according to embodiments of the invention.

Reference is now made to FIG. 5, which is a simplified diagram of a four-transistor gain cell, according to embodiments of the invention. 4T gain cell 500 (also denoted herein a 4T PMOS gain cell) includes four p-type transistors, and optionally capacitor $C_{SN}$ 540.

In gain cell 500, WBL connects to a diffusion connection write transistor 510 (PW). Feedback transistor 522 (PF) and buffer transistor 521 (PB) together serve as a retention element 520 between storage node SN and write transistor 510 (PW). Gain cell 500 includes two nodes, buffer node BN (at the junction of PW 510, PB 521 and PF 522) and storage node SN (at the junction of PB 520, PF 522, $C_{SN}$ 540 and PR 530). Feedback transistor 522 (PF) conditionally discharges the BN node according to level at the SN node. Buffer transistor 522 separates the stored data level at SN from the BN level to ensure extended retention time. The gate of read transistor 530 (PR) connects to SN. Stored data is read at the read bit line output (RBL).

In the embodiment of a 4T gain cell of FIG. 5 all four transistors are p-type. Other combinations of transistor types may be used. Optional combinations of transistor types for a 4T gain cell include:
A) Write transistor, feedback transistor, buffer transistor and read transistor are all p-type transistors;
B) Write transistor, feedback transistor, buffer transistor and read transistor are all n-type transistors (e.g. FIG. 6);
C) Write transistor, feedback transistor, buffer transistor are p-type transistors, and the read transistor is n-type (e.g. FIG. 7); and
D) Write transistor, feedback transistor and buffer transistor are n-type transistors, and the read transistor is p-type (see FIG. 8).

When the 4T gain cell includes n-type transistors and the voltage levels and cell operation are adapted to the transistor type, as known in the art.

Optionally, gain cell 500 includes four standard threshold-voltage ($V_T$) transistors and is fully compatible with standard CMOS processes. In some embodiments, PMOS transistors are used. PMOS transistors have lower sub-$V_T$ and gate leakages relative to NMOS transistor, which may provide longer retention times while maintaining a small cell area. Detailed cell operation is explained hereafter.

In some embodiments, all of the transistors in gain cell 500 are of the same type. In other embodiments, not all of the transistors in gain cell 500 are of the same type, but rather each transistor is implemented in a respective type which may vary.

A non-limiting list of transistor types which may be included in gain cell 500 includes:
A) High-VT;
B) Low-VT;
C) Standard-VT; and
D) "IO" transistors.

Figure 13A:
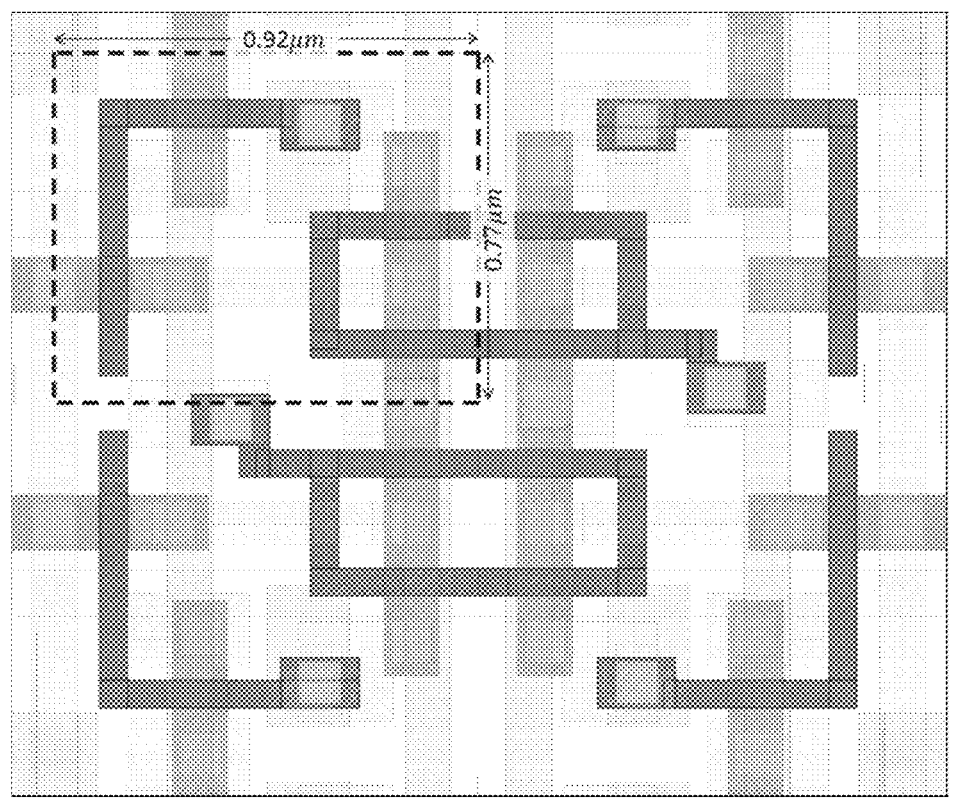
FIGS. 13A-13C show a simplified layouts of four-transistor memory cells, according to respective exemplary embodiments of the invention.
Figure 13B:
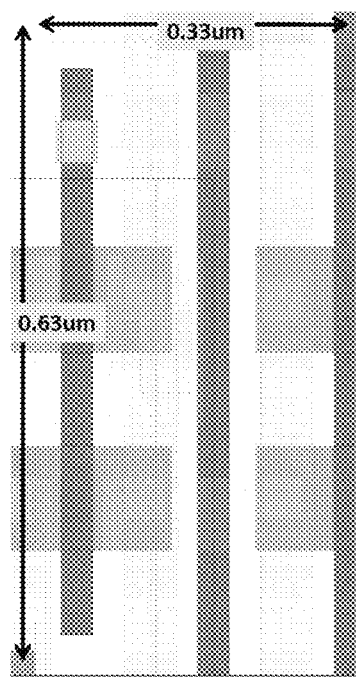

Optionally, the gain cell includes different threshold transistors (for example a combination of low-VT transistors and regular-VT transistors as illustrated in FIG. 13B).

Figure 6:
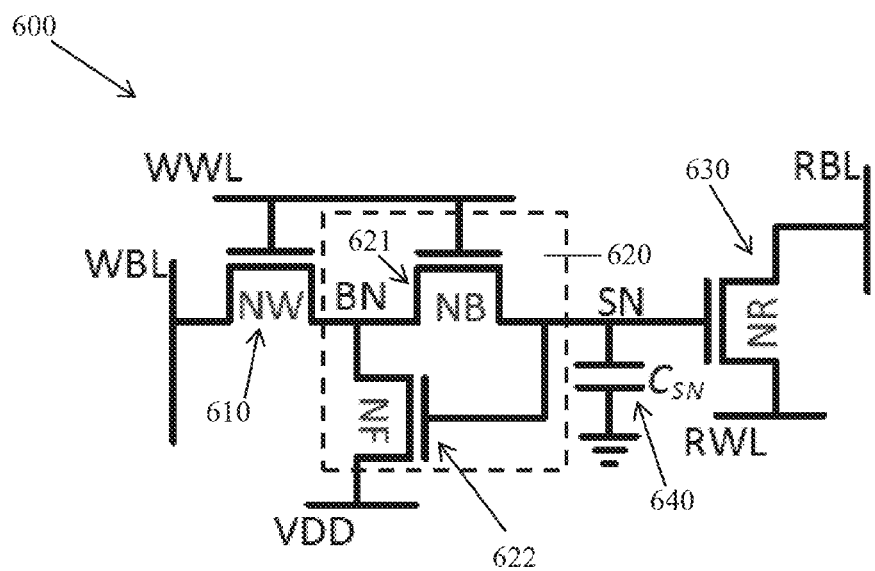
FIG. 6 is a simplified diagram of a gain cell which includes four n-type transistors, according to embodiments of the invention.

Reference is now made to FIG. 6, which is a simplified diagram of a four-transistor gain cell, according to embodiments of the invention. 4T gain cell 600 includes four n-type transistors, and optionally capacitor $C_{SN}$ 640. Write transistor (NW) 610, feedback transistor (NF) 622, buffer transistor (NB) 621 and read transistor (NR) 630 are connected similarly to the p-type embodiment of FIG. 5. Feedback transistor 622 (NF) and buffer transistor 621 (NB) together serve as a retention element 620 between storage node SN and write transistor 610 (NW). However the constant voltage input into feedback transistor 622 is VDD, as required for n-type transistor operation. During the read operation the RBL is pre-charged and RWL is discharged (in contrast with the p-type transistor embodiment of FIG. 5, in which during the read operation RBL is pre-discharged and RWL is charged.

Figure 7:
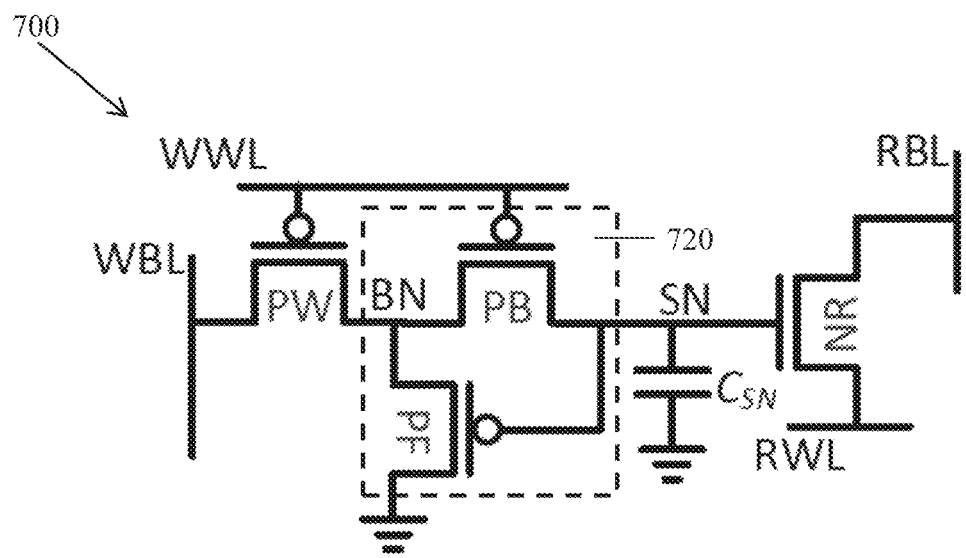
FIG. 7 is a simplified diagram of a gain cell which includes three p-type transistors and one n-type transistor, according to embodiments of the invention.

Reference is now made to FIG. 7, which is a simplified diagram of a four-transistor gain cell, according to embodiments of the invention. 4T gain cell 700 includes three p-type transistors (PW, PB and PF), and optionally capacitor $C_{SN}$. Read transistor (NR) is n-type. Write transistor PW, feedback transistor PW, buffer transistor PB and read transistor NR are connected similarly to the four p-type embodiment of FIG. 5. Feedback transistor PF and buffer transistor PB together serve as a retention element 720 between storage node SN and write transistor PW. Feedback transistor PF and buffer transistor PB together serve as a retention element between storage node SN and write transistor PW. The constant voltage input into feedback transistor PF is connected to ground.

Figure 8:
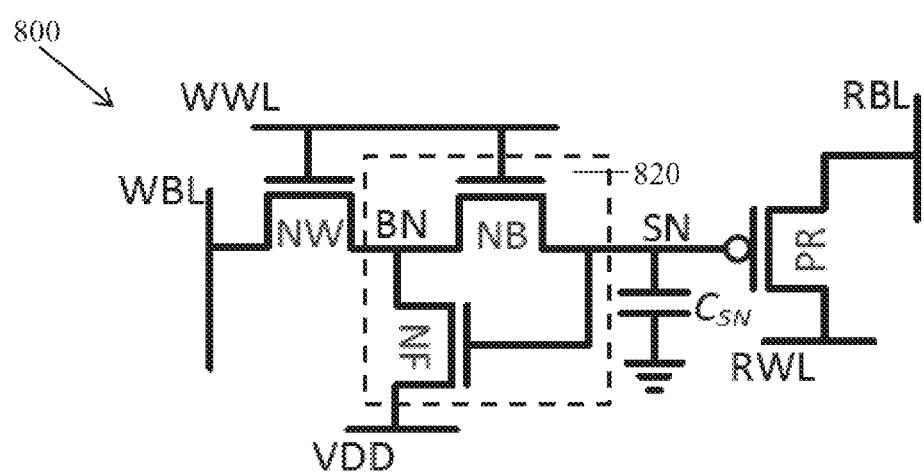
FIG. 8 is a simplified diagram of a gain cell which includes three n-type transistors and one p-type transistor, according to embodiments of the invention.

Reference is now made to FIG. 8, which is a simplified diagram of a four-transistor gain cell, according to embodiments of the invention. 4T gain cell 800 includes three n-type transistors (NW, NB and NF), and optionally capacitor $C_{SN}$. Read transistor (PR) is p-type. Write transistor NW, feedback transistor NW, buffer transistor NB and read transistor PR are connected similarly to the four n-type embodiment of FIG. 6. Feedback transistor NF and buffer transistor NB together serve as a retention element 820 between storage node SN and write transistor PW. Feedback transistor PF and buffer transistor PB together serve as a retention element between storage node SN and write transistor NW. The constant voltage input into feedback transistor NF is connected to VDD.

PMOS Four-Transistor (4T) Gain Cell

The operation of a 4T gain cell is described for a non-limiting all-PMOS gain cell configured as shown in FIG. 5. Write transistor 510 (PW), buffer transistor 521 (PB), feedback transistor 522 (PF) and read transistor 540 (PR) are all PMOS transistors.

Cell access is achieved in a similar fashion as with the PMOS 2T gain cell of FIGS. 1A and 1B. During writes, the write word line (WWL), which is connected to the gates of both PW 510 and PB 521, is pulsed to a negative voltage in order to enable a full discharge of SN (when writing a '0'). Readout is performed by pre-discharging the read bit line (RBL) to ground and subsequently charging the read word line (RWL) to $V_{DD}$. RBL is then conditionally charged if the storage node is low, and otherwise remains discharged. Optionally, a simple sense inverter is used on the readout path to save area and power. In additional or alternate embodiments, other conventional sense amplifiers are used for improved read performance.

The increased retention time of 4T gain cell 500 occurs during standby periods, when the internal feedback mechanisms come into play. During hold, PW 510 and PB 521 are off (WWL=$V_{DD}$), and worst-case retention conditions are assumed, i.e., that WBL is driven to the opposite voltage of the stored data level. For a stored data '1' (i.e. high data level), a self-limiting mechanism, similar to that of the 2T gain cell of FIGS. 1A and 1B, ensures that the level decays only slowly. In addition, the transistor stack (PW 510 and PB 521) provides resistance between SN and WBL and further lowering leakage and resulting in a slower decay compared to the 2T gain cell. For data '1', PF 522 is in deep cutoff, such that its effect on the circuit is almost negligible. However, following a write '0' (i.e. low data level) operation, $V_{SG}$ of PF 522 is equal to the voltage at BN ($V_{BN}$). This is much higher than the negative $V_{SG}$ of PB 521, and therefore any charge that leaks through PW 510 to BN will be discharged through PF 522 and not degrade the '0' level at SN. In this way, the worst-case condition of the 2T cell is eliminated and retention time is significantly increased.

In summary, the feedback path protects the weak '0' level on the SN by pulling BN to ground, while the worst-case $V_{DD}$ drop across PW 510 and the corresponding sub-$V_T$ leakage do not affect the retention time of the cell; the feedback path is disabled for the strong '1' level. Note that the proposed technique does not fully avoid the decay of a '0' level. Gate tunneling through PR 530, as well as the gate-induced drain leakage (GIDL) and junction leakage of PB 521, still charge SN, while sub-$V_T$ leakage of the turned-off PB 521 counteracts (but does not avoid) the SN charging process.

Five-Transistor (5T) Gain Cells

Optionally, the gain cell includes five transistors. The 5T gain cell may be obtained by two circuit configurations:
1) The read element is a 2T read element, the retention element is a 2T element and the write element is a single transistor. Exemplary embodiments are illustrated in FIGS. 9A-9D; and
2) The read element is a single transistor, the retention element is a 2T element and the write element is a 2T write element. Exemplary embodiments are illustrated in FIGS. 9E-9F.

Five-Transistor (5T) Gain Cells with 2T Read Element

FIGS. 9A-9D are simplified circuit diagrams of a 5T gain cell according to non-limiting exemplary embodiments of the invention. The 2T read element includes transistors MS and MR. The retention element includes transistors MB and MF, and the write element is single transistor MW.

In all of the exemplary embodiments of FIGS. 9A-9D, MS corresponds substantially to switch 432 of FIG. 4B, in the sense that it is controlled by the level at storage node SN. Thus, when the gain cell stores one logic level MS will be open whereas at the second logic level MS will be closed.

Similarly, MR corresponds substantially to switch 433, in the sense that it controlled by RWL which closes MR when a read operation is triggered.

In FIG. 9A, 2T read element 910 includes two p-type transistors (MS and MR), the write element is single p-type transistor MW and the retention element includes two p-type transistors, MB and MF.

For write, the WWL is discharged to a negative voltage in order to allow passing a strong '0' level to the cell and the value on WBL is transferred to SN. For read, the RBL is first pre-discharged to GND and RWL is driven to GND. When the gain cell holds '0', a current path is enabled between VDD, connected at the diffusion of MS, and RBL, thereby charging RBL to VDD. On the other hand, when the cell holds '1', MS is in cut-off and therefore RBL remains at '0'. The RBLs of each column are connected to a sense inverter, which outputs the logic level of the cell.

During hold, MW and MB are off (WWL=VDD). Assuming worst-case retention conditions, WBL is driven to the opposite voltage of the stored data level. For a stored '1', a self-limiting mechanism ensures that the level decays slowly. In addition, the transistor stack (MW and MB) provides more resistance between SN and WBL and results in leakage and a slower decay compared to the conventional 2T cell. For data '1', MF is in deep cutoff, such that its effect on the circuit is almost negligible. However, following a write '0' operation, VSG of MF is equal to the voltage at BN (VBN). This is much higher than the negative VSG of MB, and therefore any charge that leaks through MW to BN will be discharged through MF and not degrade the '0' level at SN. In this way, the worst-case condition of the 2T cell is eliminated and retention time is significantly increased. In summary, the feedback path protects the weak '0' state on the SN by pulling BN to ground, while the worst-case VDD drop across MW and the corresponding leakage do not affect the retention time of the cell; the feedback path is disabled for the strong '1' level.

Figure 9D:
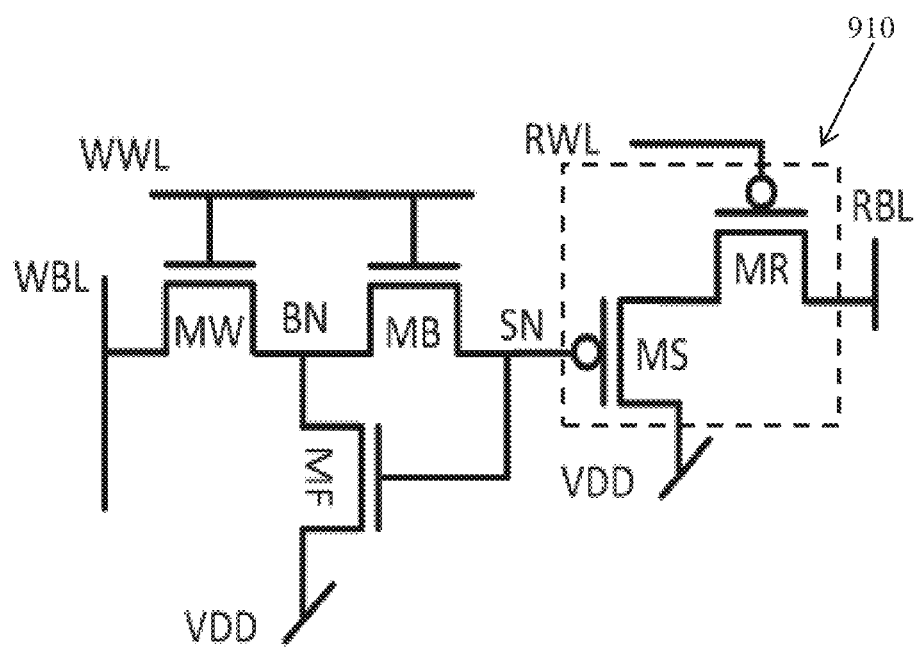
Figure 9E:
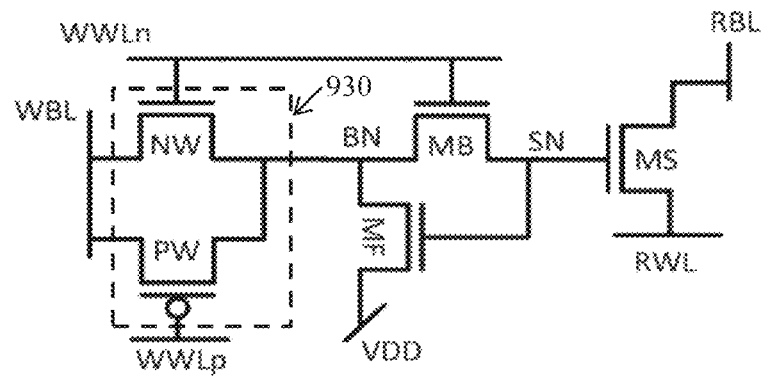
Figure 9F:
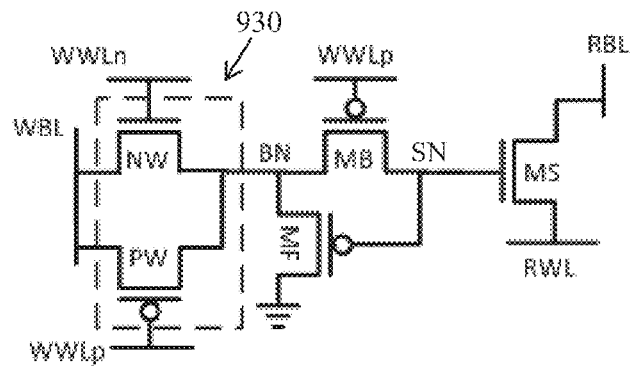

FIGS. 9B-9D show additional exemplary embodiments of the 5T gain cell. As will be appreciated by a person of skill in the art, given the proper levels for WBL, WWL, RWL and the constant voltage levels connected to the retention element and the read element, the basic operating principle (i.e. using read element transistor MR to decouple SN from RBL) is the same.

In FIG. 9B, read element 920 includes two n-type transistors and the write transistor and retention element are p-type transistors.

In FIG. 9C, read element 920, the write transistor and the retention element are all p-type transistors.

In FIG. 9D, read element 910 includes two p-type transistors and the write transistor and retention element are n-type transistors.

Five-Transistor (5T) Gain Cells with 2T Write Element

FIGS. 9E-9F are simplified circuit diagrams of a 5T gain cell according to non-limiting exemplary embodiments of the invention. 2T write element 930 includes transistors NW and PW. The retention element includes transistors MB and MF; and the read element is a single transistor MS. The basic operating principles of the 2T write cell correspond substantially to those of the 2-SW write element of FIG. 4D. Transistors NW and PW open and close at complementary voltage levels, corresponding substantially to switches 412 and 413 of FIG. 4D.

In 2T write element 930, p-type transistor (PW) connected in parallel to n-type NW. The gates of PW and NW are connected respectively to the complementary word lines, WWLp and WWLn. A common write bit line (WBL) is used to drive data through write element 930 during write operations.

Six-Transistor (6T) Gain Cells

Figure 9G:
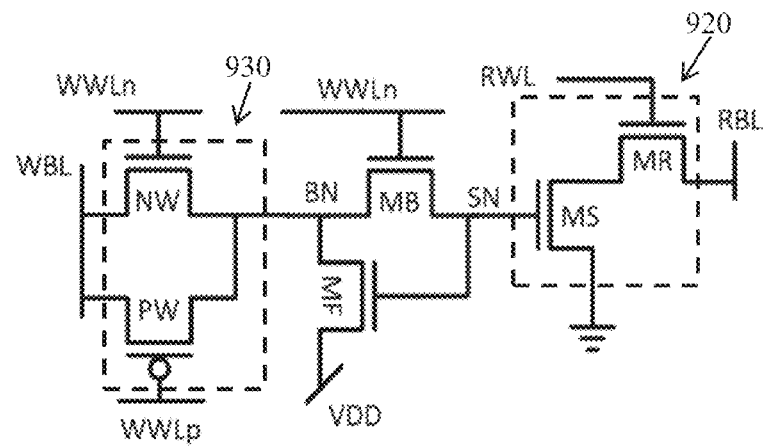
FIG. 9G is a simplified diagram of a 6T gain cell, according to embodiments of the invention.

FIG. 9G is a simplified circuit diagram of a 6T gain cell according to a non-limiting exemplary embodiment of the invention. Write element, retention element and read element are all respectively implemented by two transistors, resulting in a six transistor (6T) gain cell. The structure of the 2T write element corresponds to write element 930; the structure of the 2T retention element corresponds to retention element 820; and the structure of the 2T read element corresponds to read element 920.

Memory Array

Figure 10:
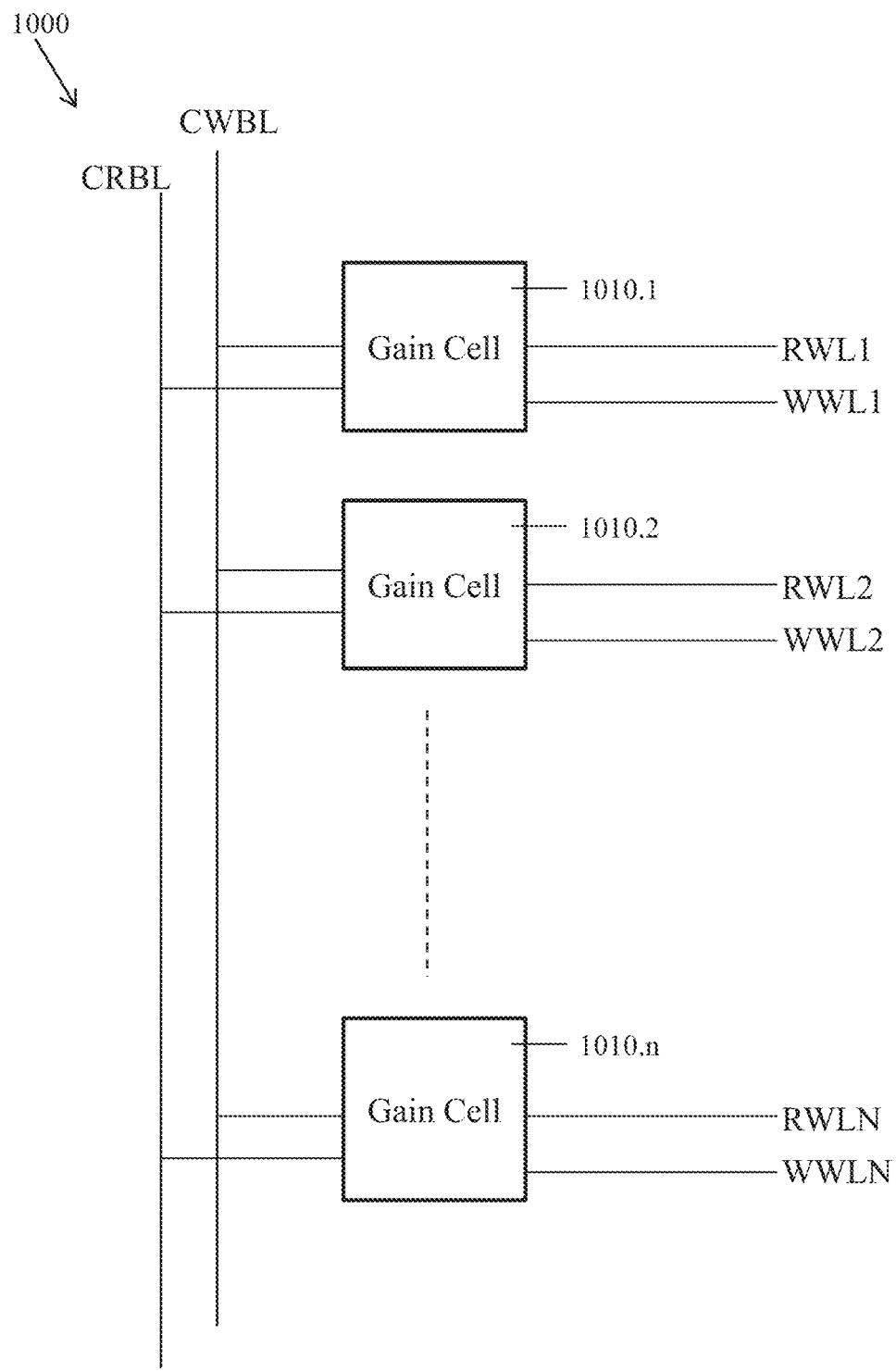
FIG. 10 is a simplified block diagram of a memory array, according to embodiments of the invention.

Reference is now made to FIG. 10 which is a simplified block diagram of a memory array, according to embodiments of the invention.

Memory array 1000 includes an array of gain cells 1010.1 to 1010.n, with respective write trigger inputs (WWL1 to WWLN) and read trigger outputs (RWL1 to RWLN). The write bit lines inputs (WBLs) of the gain cells in the array are connected together to form a common write bit line (CWBL). Similarly, the read bit line outputs (RBLs) of the gain cells are connected together to form a common read bit line output (CRBL). This creates a memory array with gain cells that may be written and read in unison. The type of gain cells forming the array may be any one or combination of 4T and/or 5T and/or 6T gain cells as described herein. Optionally, memory array 1000 includes one or more additional types of gain cells known in the art which are compatible with the other gain cells 4T and/or 5T and/or 6T gain cells in the array.

Embodiments herein present gain cells which may be used for scaled CMOS nodes characterized by high leakage currents, and which may be embedded in a GC-eDRAM. The gain cell design protects the weak data level by a conditional, cell-internal feedback path, while the feedback is disabled for the strong data level. Optionally, the read element decouples the storage node from the read bit line eliminating leakage currents through non-selected gain cells resulting in a full voltage swing at RBL. The gain cell embodiments require low retention power and improved worst case retention time. This is achieved with a small cell area relative to a 6T SRAM in the same technology, making the embodiments herein an appealing high-density, low-leakage alternative.

It is expected that during the life of a patent maturing from this application many relevant transistor types and transistor technologies will be developed and the scope of the term transistor is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find simulation support in the following examples.

EXAMPLES

Reference is now made to the following examples, which together with the above descriptions illustrate some embodiments of the invention in a non limiting fashion.

Simulation Results for 4T PMOS Gain Cell

The simulation results presented below are for a 64×32 bit (2 kb) memory macro based on the 4T PMOS gain cell 500 of FIG. 5. The memory macro was designed in a low-power CMOS 65 nm process. All devices were implemented with standard $V_T$ transistors to provide logic process compatibility. The operating voltage was selected to be 700 mV in order to demonstrate compatibility with power-aware (near-threshold) applications.

Figure 11A:
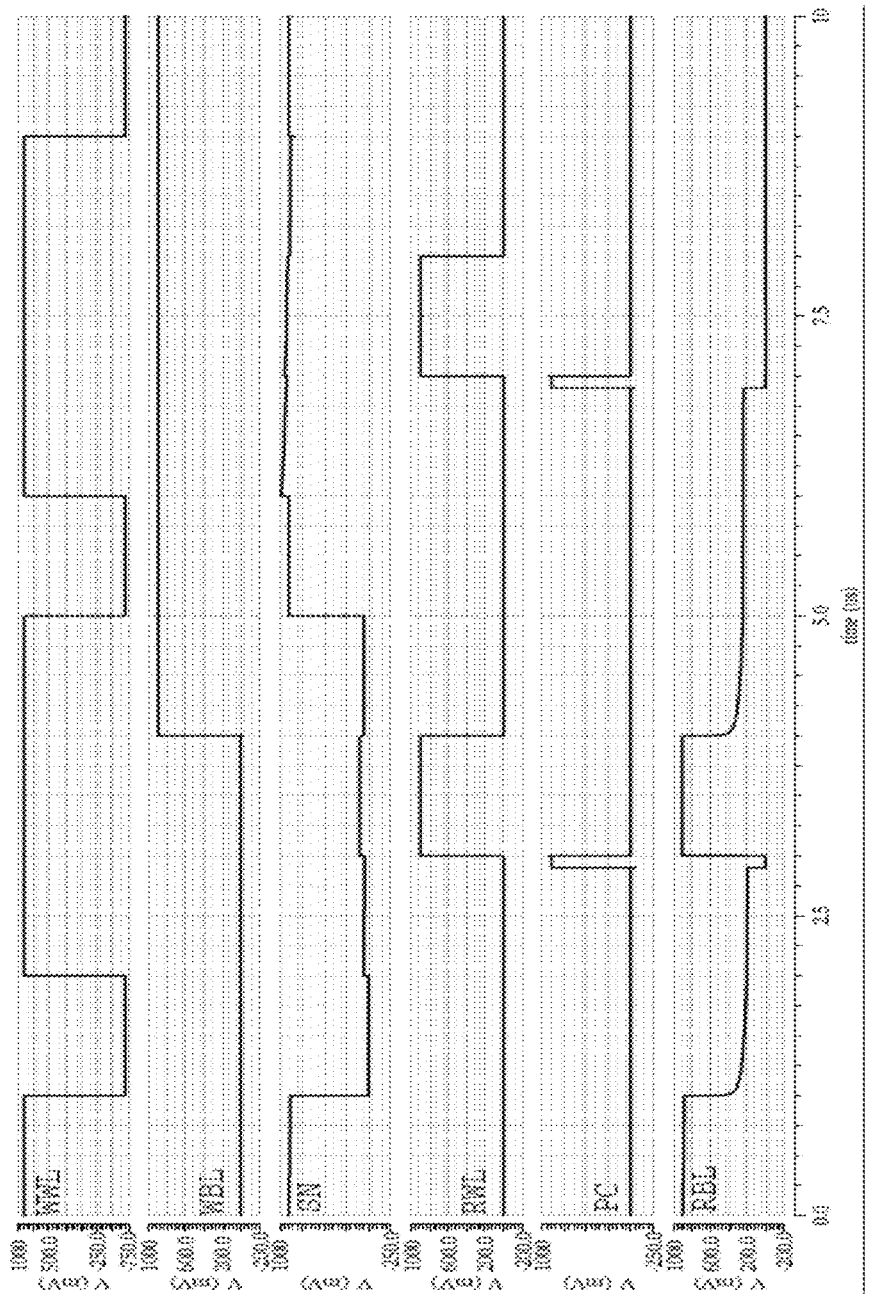
FIG. 11A is a timing diagram demonstrating 4T PMOS gain cell operation, according to embodiments of the invention.

Reference is now made to FIG. 11A which is a timing diagram demonstrating 4T PMOS gain cell operation through subsequent write and read operations.

Initially, a '0' is written to SN by pulsing WWL to a negative voltage (−700 mV), thereby discharging SN through WBL. Next, a read operation is performed by pre-discharging RBL by pulsing the PC control signal (not shown), and subsequently charging RWL. As required, RBL is driven high through PR. Prior to the next assertion of WWL, WBL is driven high in order to write a '1' to SN. During the next read cycle, the pre-discharged RBL remains low, as the stored '1' level blocks the discharge path through PR 530.

Figure 11B:
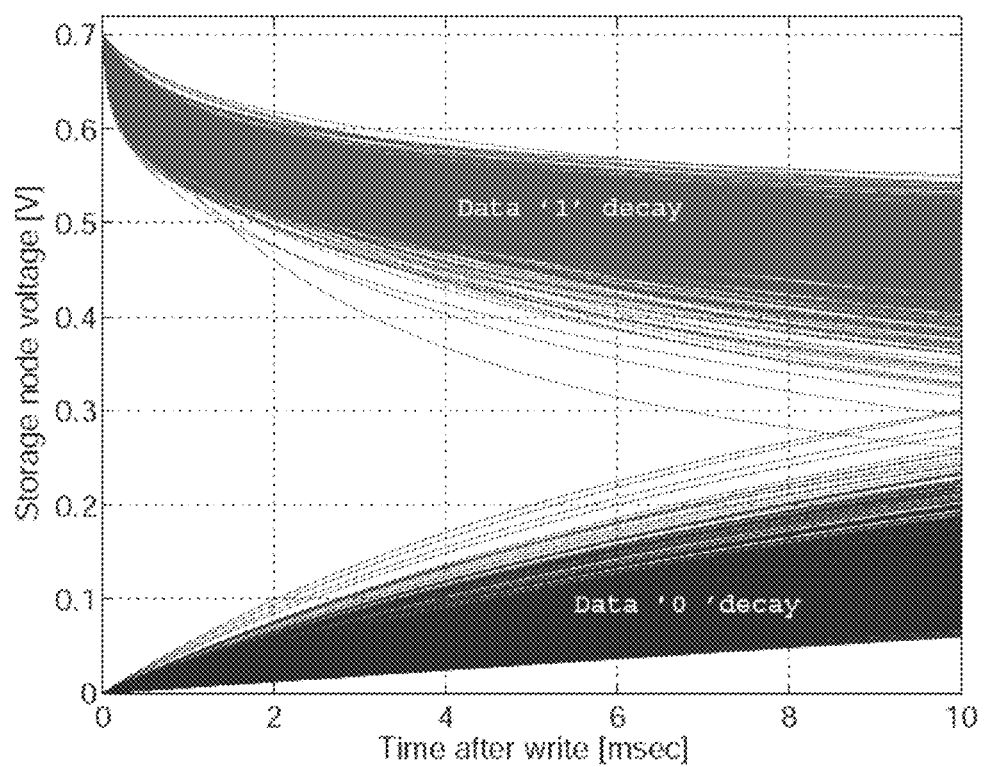
FIG. 11B shows storage node degradation of a 4T PMOS gain cell following a write operation under the worst-case WBL bias conditions, according to embodiments of the invention.

Reference is now made to FIG. 11B shows storage node degradation of a 4T PMOS gain cell following a write operation under the worst-case WBL bias conditions. The results of FIG. 11B may be compared to those presented in FIG. 2 for the 2T PMOS gain cell. 1024 Monte Carlo samples were simulated in a 65 nm CMOS process with a 700 mV supply, driving WBL to the opposite voltage of that stored on SN (similarly to FIG. 2). The level degradation seen in FIG. 11B is not only much more balanced than the extremely asymmetric degradation of the 2T PMOS cell, but it is also more than an order of magnitude higher.

The estimated DRT, extracted from the results shown in FIG. 11B, is 8.29 ms at 27 C.° and 3.98 ms at 85 C.°. This is over 3 times higher than the best retention time reported so far in a 65 nm CMOS node [ref. 9]. Moreover, the symmetric behavior of the two data states is more appropriate for differentiating between data '0' and data '1' levels, easing the design of a specific readout circuit and potentially further enhancing the actual retention time (i.e. latest successful read) compared to the 2T PMOS cell.

Chun et al. [ref. 3] previously showed that a standard 2T GC-eDRAM may exhibit lower retention power than a similarly sized SRAM in 65 nm CMOS. Since the retention time of the presented 4T PMOS gain cell is over 40 times higher than that of a standard 2T cell, the retention power (composed of leakage and refresh power) is even lower. For the simulated 4T PMOS gain cell memory macro, the retention power was found to be 3.86 pW/bit at 27 C and 53.78 pW/bit at 85 C. These retention powers are almost 5 times less than the leakage power of a 6T-bitcell SRAM operated at 0.7 V.

Figure 12A:
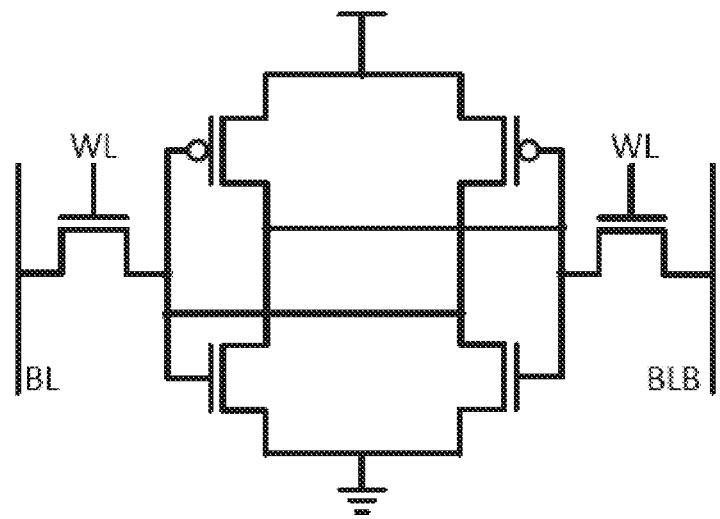
FIGS. 12A-12C are simplified cell structure diagrams of a 6T SRAM, 2T1C gain cell and 2T gain cell respectively.
Figure 12B:
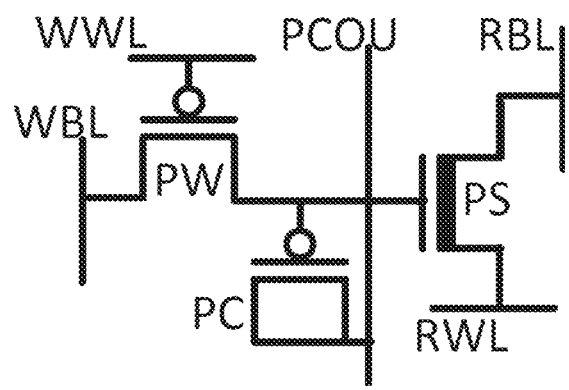
Figure 12C:
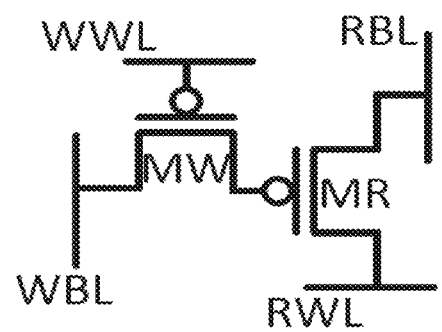

A comparison between the proposed cell and other embedded memories is presented in Table 1. Simplified cell structure diagrams of the 6T SRAM, 2T1C gain cell and 2T gain cell (referred to in Table 1) are shown in FIGS. 12A to 12C respectively.

TABLE 1

| Cell Type | 6T SRAM | 2T1C gain cell | 2T gain cell | 4T PMOS gain cell |
|---|---|---|---|---|
| Drawn Cell Size | 1.18 μm²(1X) | 0.69 μm²(0.58X) | 0.27 μm²(0.23X) | 0.71 μm²(0.6X) |
| Supply Voltage ($V_{DD}$) | 1.1 V | 1.1 V | 1.1 V | 0.7 V |
| Worst Case Retention Time | Static | 0.5 ms@85 C. | 10 s@85 C. | 3.98 ms@85 C. |
| Retention Power | 264.58 pW@85 C., $V_{DD}$ = 0.7 V; | 158 pW@85 C. | 1.95 μW@85 C. | 53.78 pW@85 C, $V_{DD}$ = 0.7 V; |

TABLE 1-continued

| Cell Type | 6T SRAM | 2T1C gain cell | 2T gain cell | 4T PMOS gain cell |
|---|---|---|---|---|
| | 564.29 pW@85 C., $V_{DD}$ = 1.1 V | | | 126.9 pW@85 C., $V_{DD}$ = 1.1 V |

Table 1 clearly emphasizes the benefits of the 4T PMOS gain cell, which achieves much lower power usage due to its increased retention time.

Performance of the proposed 4T cell is summarized in Table 2. At 700 mV, the active refresh energy is 6.89 fJ/bit, composed of 5.88 fJ/bit for read and 1.01 fJ/bit for write. The 4T PMOS gain cell has a read delay of 2.32 ns (using a slow but small sense inverter) and a write delay of 0.4 ns (with and underdrive of −700 mV). A conventional 2T gain-cell was measured to have a 0.29 ns write delay, which is the same order of magnitude as the proposed cell.

TABLE 2

| Technology | 65nm LP CMOS |
|---|---|
| Cell Area | 0.708 µm² |
| 4T eDRAM/6T SRAM Cell Area Ratio | 0.6 |
| Supply Voltage | 700 mV |
| Worst Case Retention Time | 8.29 ms@27 C. |
| | 3.98 ms@85 C. |
| Write Delay (worst) | 0.4 ns@85 C. |
| Read Delay (worst) | 2.32 ns@85 C. |
| Active Read Energy | 5.88 fJ/bit@85 C. |
| Active Write Energy | 1.01 fJ/bit@85 C. |
| Active Refresh Energy | 6.89 fJ/bit@85 C. |
| Leakage Power/bit | 2.87 pW@27 C. |
| | 51.29 pW@85 C. |
| Retention Power/bit | 3.86 pW@27 C. |
| | 53.78 pW@85 C. |

Reference is now made to FIG. 13A which shows a simplified layout of an exemplary four-transistor GC-eDRAM memory. The marked dimensions are of a single 4T PMOS gain cell. It is seen that the cell area is 0.92 µm by 0.77 µm.

Reference is now made to FIG. 13B which shows a simplified layout of an exemplary four-transistor bit cell. The cell dimensions are 0.4 µm by 0.63 µm (i.e. 0.252 µm2). The cell features WBL and RBL lines routed in M2, RWL and VDD lines routed in M3, and a WWL routed in poly. Minimum sized devices were used for the implementation of the 4T cell, which is composed of two low-VT transistors (NF and NR) and two regular-VT transistors (NW and NB).

Figure 13C:
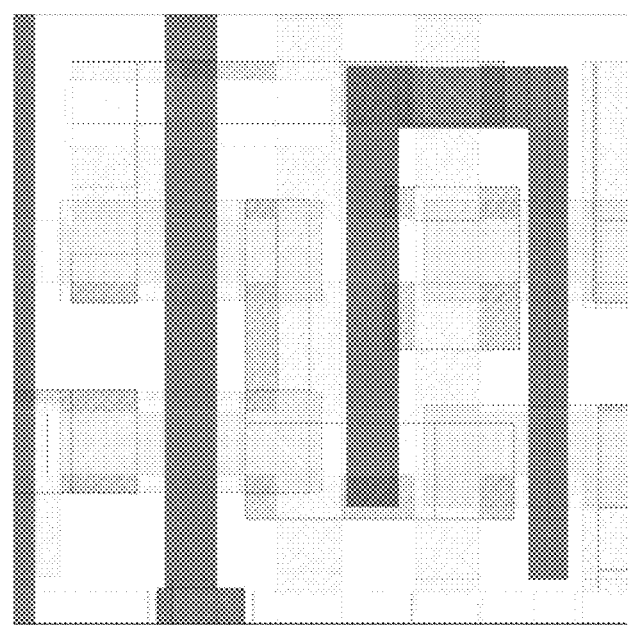

Reference is now made to FIG. 13C which shows a simplified layout of an exemplary four-transistor NMOS cell. The cell dimensions are 0.488 µm by 0.482 µm (i.e. 0.235 µm2). The cell features WBL and RBL lines routed in a horizontal M2 as they are shared among all the cells in the column. RWL is routed in a vertical M3, and WWL is routed in poly to reduce its capacitance, allowing faster charge during write and lower dynamic energy consumption. The layout complies with thin-cell requirements of deeply-scaled process nodes, avoiding bends in polysilicon and diffusion layers, and with all transistors oriented in one direction.

In summary, simulations of an exemplary embodiment of a four-transistor (4T) GC-eDRAM memory show a threefold increase in retention time, as compared to the best previously proposed gain cell in the same 65 nanometer node technology, or using the same Production Design Kit (PDK) for simulations and/or manufacturing [ref. 7]. The improved retention time results in a factor of ten decrease in retention power (static plus refresh power) as compared to the static power of a 65 nm 6T SRAM [ref. 8]. The improved performance is achieved with a gain cell that is 40% smaller than a 6T SRAM cell in the same technology. This enables the creation of a high density memory array with low power integration.

Simulation Results for 5T PMOS Gain Cell

Simulation results are now presented for the 5T gain cell illustrated in FIG. 9A.

The DRT of GC-eDRAM cells is often estimated using their data degradation curves, demonstrating the deterioration of a '0' and '1' levels stored in the SN, when the WBL is charged to the opposite value, resulting in the maximum leakage currents.

Figure 14:
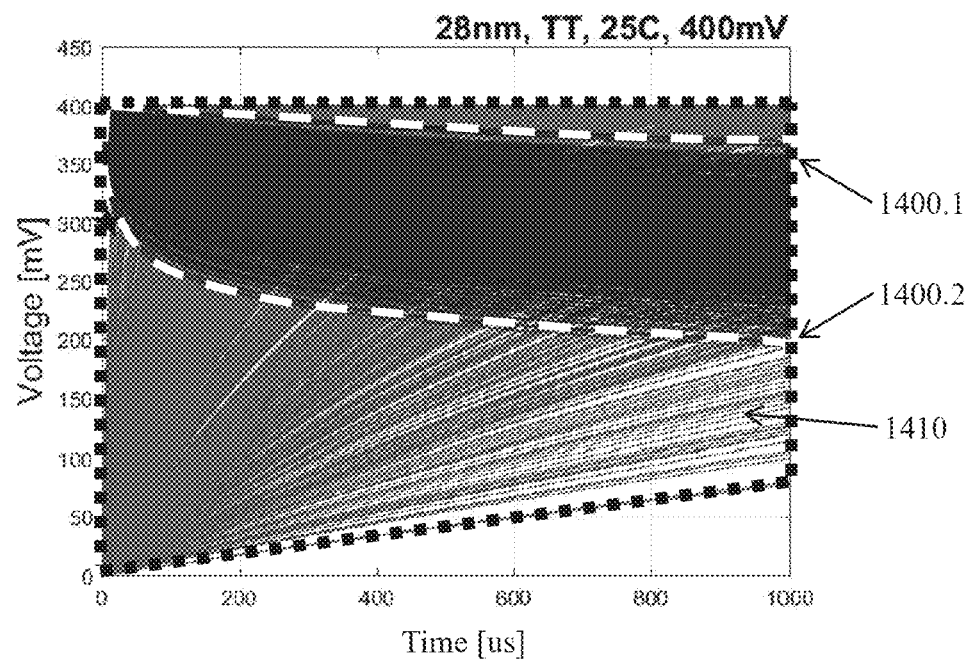
FIG. 14 shows simulation results of storage node degradation of a 3T PMOS gain cell following a write operation under the worst-case WBL bias conditions.
Figure 15:
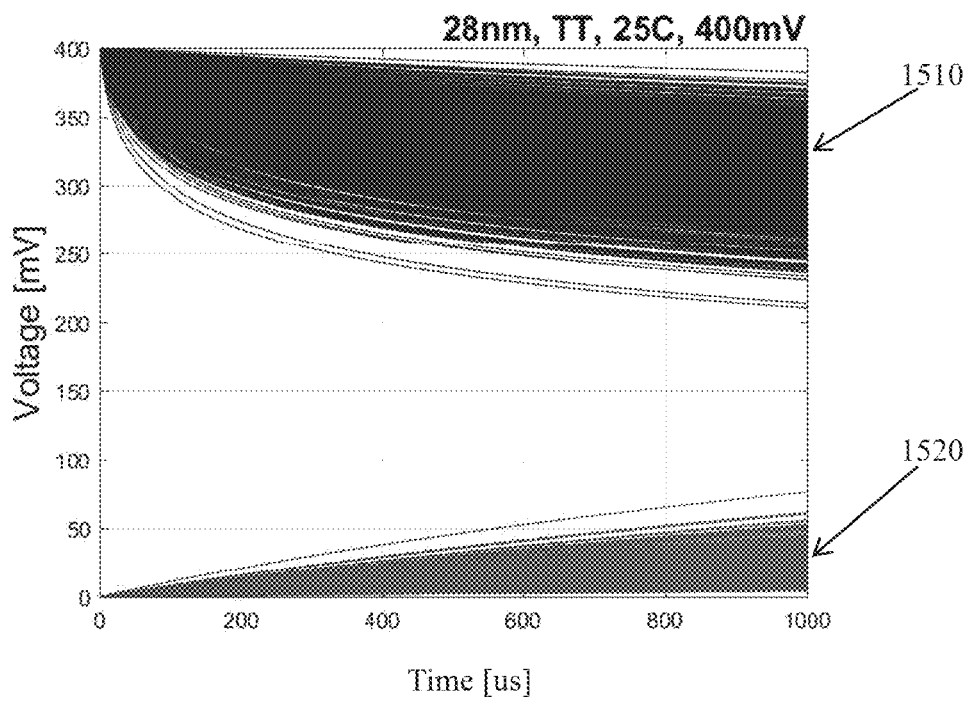
FIG. 15 shows simulation results of storage node degradation of a 5T PMOS gain cell following a write operation under the worst-case WBL bias conditions.

FIGS. 14 and 15 shows a comparison of the data degradation curves of a conventional 3T gain cell and the 5T gain cell respectively, following a write operation under worst case WBL bias conditions. The results in FIGS. 14 and 15 were extracted from 1000 Monte-Carlo simulations modeling both mismatch and process variations. While the worst-case DRT of a conventional 3T is as low as 6 µs, the DRT of the proposed 5T cell is almost three orders of magnitude higher at 1 ms. (The DRT was estimated at the time when the voltage difference between the two levels reached beneath 150 mV.)

In FIG. 14, the curves between dashed lines 1400.1 and 1400.2 show the degradation of a read '1' operation in a 3T bitcell. The curves within the region 1410 (delineated by a dotted line) show the degradation of a read '0' operation in the 3T bitcell. The overlap in the two regions reduces the readability of the 3T gain cell.

In contrast, in the 5T gain cell the degradation of a read '1' operation (1510) and the degradation of a read '0' operation (1520) are clearly distinguished.

Figure 16:
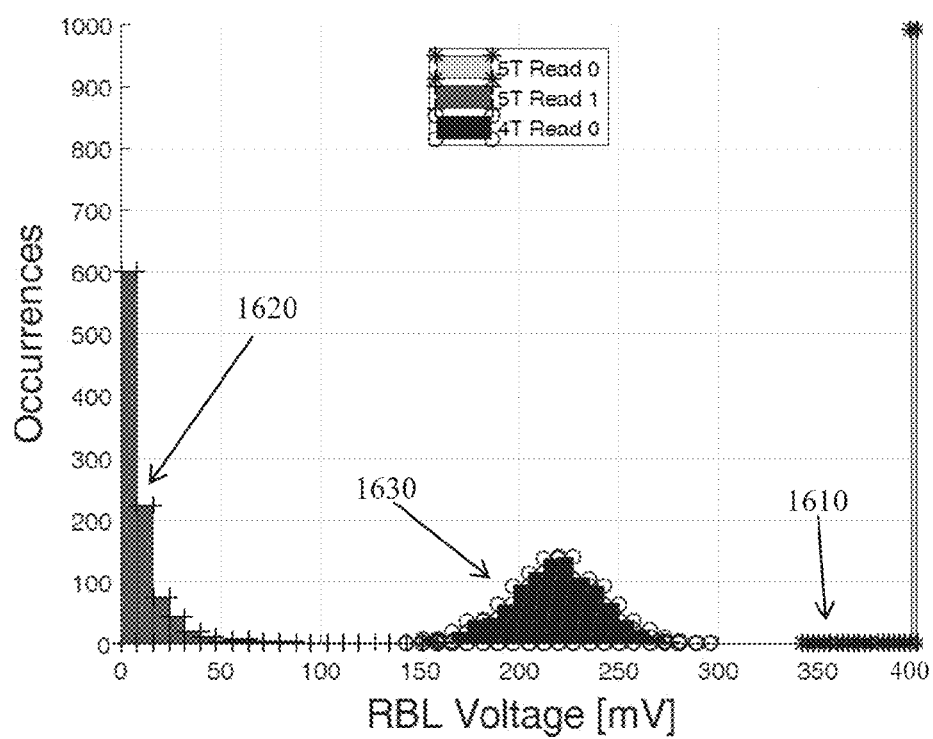
FIG. 16 shows simulation results of the distribution of the RBL voltage following read '1' and read '0' operations of the 5T gain-cell and read '0' operation of a 4T gain cell.

To verify the readability of the 5T gain cell, FIG. 16 plots the distribution of the RBL voltage following read '0' and read '1' operations with a cycle time of 1 µs (1 Mhz) following a 1 ms retention period, as well as the distribution of the RBL voltage of a 4T cell following a read '0' operation. The comparison is made to a 4T cell due to its high DRT compared to the 3T cell. The simulation included layout extracted parasitics and was performed under worst-case readout conditions, which occur when all unselected cells in a column store '0'. Under this scenario, the sub-VT leakage from unselected cells in the column to the RBL is maximized.

Nevertheless, FIG. 16 shows that the RBL voltage distributions of the RBL voltage of the 5T cell for read '0' (1610 in FIG. 16) and read '1' (1620 in FIG. 16) are clearly separated, indicating that the distribution of the trip point of the sense amplifier should fit between them with an offset of less than 200 mV. On the other hand, the distribution of the RBL voltage of a 4T cell (1630 in FIG. 16) resides in the middle of the voltage range with an average value of 230 mV, due to leakage currents from RBL to unselected cells in the array, and thereby resulting in an unreliable readout.

Table 3 compares the designed 5T gain cell with other ultra-low power embedded memory options, including an 8T SRAM cell, a 9T SRAM cell, a 10T SRAM cell and a 3T gain cell.

TABLE 3

|  | 8T SRAM | 9T SRAM | 10T SRAM | 3T Gain-Cell | 5T Gain-Cell |
| --- | --- | --- | --- | --- | --- |
| Cell size | 452 $F^2$ | 651 $F^2$ | 670 $F^2$ | 192 $F^2$ | 373 $F^2$ |
| Size ration To 6T SRAM | 1.31X | 1.76X | 1.94X | 0.55X | 1.08X |
| Supply voltage | 400 mV | 400 mV | 400 mV | 400 mV | 400 mV |
| Data retention time | Static | Static | Static | 4 µs @ 25 C. | 1 µs @ 25 C. |
| Leakage power | 17.6 pW/bit @ 25 C. | 17.9 pW/bit @ 25 C. | 19.1 pW/bit @25 C. | 3.4 pW/bit @ 25 C. | 2.9 pW/bit @ 25 C. |
| Retention Power (Leakage + [Refresh]) |  |  |  | 812 pW/bit @ 25 C. | 11.5 pW/bit @ 25 C. |

A conventional 6T SRAM gain cell was omitted from the comparison since it is not compatible with sub-VT operating voltages. Nonetheless, the area ratios of the bitcells compared to the area of a conventional 6T SRAM cell are given in the table. While the 8T and 10T bitcells provide increased noise margins and sub-VT operation, their bitcell sizes are 31% and 94% larger than the 6T cell, respectively. On the other hand, the 5T gain cell is only 8% larger than the conventional 6T cell and between 20%-45% smaller than the 8T and 10T bitcells. While the 3T gain cell offers the highest memory density, its DRT is only 6 µs, resulting in a retention power of 812 pW/bit, which is significantly higher than that of the other memory cells. On the other hand the retention time of the 5T gain cell is extended to 1 ms, resulting in the smallest retention power consumption of 11.5 pW/bit.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] International technology roadmap for semiconductors—2012 update," 2012. [Online]. Available: www(dot)itrs(dot)net.
[2] D. Somasekhar et al., "2 GHz 2 Mb 2T gain cell memory macro with 128 GBytes/sec bandwidth in a 65 nm logic process technology," IEEE JSSC, vol. 44, no. 1, pp. 174-185, 2009.
[3] K. Chun et al., "A 667 MHz logic-compatible embedded DRAM featuring an asymmetric 2T gain cell for high speed on-die caches," IEEE JSSC, 2012.
[4] Y. Lee et al., "A 5.4 nW/kB retention power logic-compatible embedded DRAM with 2T dual-VT gain cell for low power sensing applications," in Proc. IEEE A-SSCC, 2010.
[5] P. Meinerzhagen, A. Teman, R. Giterman, A. Burg, and A. Fish, "Exploration of sub-VT and near-VT 2T gain-cell memories for ultra-low power applications under technology scaling," Journal of Low Power Electronics and Applications, vol. 3, no. 2, pp. 54-72, 2013.
[6] A. Teman, P. Meinerzhagen, A. Burg and A. Fish, "Review and classification of gain cell edram implementations," in Proc. IEEEI. IEEE, 2012, pp. 1-5.
[7] K. C. Chun et al., "A sub-0.9V logic-compatible embedded DRAM with boosted 3T gain cell, regulated bit-line write scheme and PVT-tracking read reference bias," in Proc. IEEE Symposium on VLSI Circuits, 2009.
[8] K. Zhang et al., "A 3-ghz 70 mb sram in 65 nm cmos technology with integrated column-based dynamic power supply," in Proc. IEEE ISSCC, 2005, pp. 474-611 Vol. 1.
[9] K. C. Chun et al., "A 2T1C embedded DRAM macro with no boosted supplies featuring a 7T SRAM based repair and a cell storage monitor," IEEE JSSC, vol. 47, no. 10, pp. 2517-2526, 2012.

What is claimed is:

1. A gain cell, comprising:
a write bit line input;
a read bit line output;
a write trigger input;
a read trigger input;
a write element, comprising a write bit line connection connected to said write bit line input, a write trigger connection connected to said write trigger line input and a buffer node connection connected to an internal buffer node, configured to write a data level from said write bit line input to said gain cell when triggered by said write trigger input;
a retention element associated with said write element, configured to buffer between said buffer node and an internal storage node during data retention, and to connect said buffer node to a first constant voltage during retention of a first data level at said storage node and to disconnect said buffer node from said first constant voltage during retention of a second data level at said storage node; and
a read element associated with said retention element, configured to decouple said storage node from said read bit line output during data read, and to connect said read bit line output to a second constant voltage when a data level associated with said second constant voltage is read from said gain cell and to disconnect said read bit line output from said second constant voltage when an opposite data level is read from said gain cell.

2. A gain cell according to claim 1, said read element comprising:
a first read switch comprising a first read data input, a first read control input and a first read data output; and
a second read switch comprising a second read data input, a second read control input and a second read data output,
wherein said first read data input is connected to said second constant voltage level, said first read control input is connected to said storage node, said first read data output is connected to said second read data input, said second read control input is connected to said read trigger input, and said second read data output is connected to said read bit line output.

3. A gain cell according to claim 1, wherein said write element and said retention element comprise n-type transistors, said read element comprises p-type transistors and said first voltage level equals said second voltage level.

4. A gain cell according to claim 1, wherein said write element and said retention element comprise p-type transistors, said read element comprises n-type transistors and said first voltage level equals said second voltage level.

5. A gain cell according to claim 1, wherein said write element, said retention element and said read element comprise a same type of transistor, and said first voltage level differs from said second voltage level.

6. A gain cell according to claim 1, said write element comprising:
a first write switch comprising a first write data input, a first write switch input and a first write data output; and
a second write switch comprising a second write data input, a second write control input and a second write data output,
said first write switch and said second write switch being of complementary types, wherein said first write data input and said second write data input are connected to said write bit line input, said first write control input and said second write control input are respectively connected to said write trigger input and to a complementary write trigger line, and said first write data output and said second write data output are connected to said buffer node.

7. A gain cell according to claim 6, wherein said first write switch comprises a p-type transistor and said second write switch comprises an n-type transistor.

8. A gain cell according to claim 1, wherein said retention element is configured to connect said buffer node to said storage node during a write bit operation and to disconnect said buffer node from said storage node during data retention.

9. A gain cell according to claim 1, wherein said retention element comprises:
a buffer switch, having a buffer input, a buffer output and a buffer control input; and
a feedback switch associated with said buffer switch, having a feedback input, a feedback output and a feedback control input, wherein said feedback input is connected to said first constant voltage;
said buffer switch input being connected to said buffer node and to said feedback switch output, and said buffer switch output being connected to said storage node and to said feedback control input and said buffer control input being connected to said write trigger input,
wherein said buffer switch is configured to connect said buffer input to said buffer output when said write trigger is on and to disconnect said buffer input from said buffer output when said write trigger is off, and wherein said feedback switch is configured to connect said feedback input to said feedback output when said feedback control input is at said first data level and to disconnect said feedback input from said feedback output when said feedback control input is at said second data level.

10. A gain cell according to claim 1, comprising a plurality of transistors, wherein at least two of said transistors operate at different threshold voltages.

11. A memory array comprising a plurality of gain cells according to claim 1, wherein respective write bit line inputs of said gain cells are connected to form a common write bit line, and respective read bit line outputs of said gain cells are connected to form a common read bit line output.

12. A gain cell, comprising:
a write bit line input;
a read bit line output;
a write trigger input;
a read trigger input;
a write element, comprising:
a first write switch comprising a first write data input, a first write control input and a first write data output; and
a second write switch comprising a second write data input, a second write control input and a second write data output,
said first write switch and said second write switch being of complementary types, wherein said first write data input and said second write data input are connected to said write bit line input, said first write control input and said second write control input are respectively connected to said write trigger input and a complementary write trigger line, and said first write data output and said second write data output are connected to an internal buffer node;
a retention element associated with said write element, configured to buffer between said buffer node and an internal storage node during data retention, and to connect said buffer node to a first constant voltage during retention of a first data level at said storage node and to disconnect said buffer node from said first constant voltage during retention of a second data level at said storage node; and
a read element associated with said retention element, comprising a read bit line connection connected to said read bit line output, a read trigger connection connected to said read trigger input and a storage node connection connected to said storage node, configured to retain said read bit line output at its present voltage level when a first data level is read from said gain cell and to drive said read bit line output to a different voltage level when an opposite data level is read from said gain cell.

13. A gain cell according to claim 12, wherein said read element is configured to decouple said storage node from said read bit line output during data read, and to connect said read bit line output to a second constant voltage when a data level associated with said second constant voltage is read from said gain cell and to disconnect said read bit line output from said second constant voltage when an opposite data level is read from said gain cell.

14. A gain cell according to claim 12, said read element comprising:
a first read switch comprising a first read data input, a first read control input and a first read data output; and a second read switch comprising a second read data input, a second read control input and a second read data output, wherein said first read data input is connected to a second constant voltage level, said first read control input is connected to said storage node, said first read data output is connected to said second read data input, said second read control input is connected to said read trigger input, and said second read data output is connected to said read bit line output.

15. A gain cell according to claim 12, wherein said retention element comprises:

a buffer switch, having a buffer input, a buffer output and a buffer control input; and a feedback switch associated with said buffer switch, having a feedback input, a feedback output and a feedback control input, wherein said feedback input is connected to said first constant voltage;

said buffer switch input being connected to said buffer node and to said feedback switch output, and said buffer switch output being connected to said storage node and to said feedback control input and said buffer control input being connected to said write line input, wherein said buffer switch is configured to connect said buffer input to said buffer output when said write trigger is on and to disconnect said buffer input from said buffer output when said write trigger is off, and wherein said feedback switch is configured to connect said feedback input to said feedback output when said feedback control input is at said first data level and to disconnect said feedback input from said feedback output when said feedback control input is at said second data level.

16. A gain cell according to claim 12, comprising a plurality of transistors, wherein at least two of said transistors operate at different respective threshold voltages.

17. A memory array comprising a plurality of gain cells according to claim 12, wherein respective write bit line inputs of said gain cells are connected to form a common write bit line, and respective read bit line outputs of said gain cells are connected to form a common read bit line output.

* * * * *